(12) United States Patent
Kim et al.

(10) Patent No.: US 11,792,947 B2
(45) Date of Patent: Oct. 17, 2023

(54) ELECTRONIC DEVICE INCLUDING FLEXIBLE DISPLAY

(71) Applicant: SAMSUNG ELECTRONICS CO., LTD., Suwon-si (KR)

(72) Inventors: Jongkeun Kim, Suwon-si (KR); Jongyoon Kim, Suwon-si (KR); Yeonggyu Yoon, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 240 days.

(21) Appl. No.: 17/434,177

(22) PCT Filed: Aug. 17, 2021

(86) PCT No.: PCT/KR2021/010857
§ 371 (c)(1),
(2) Date: Aug. 26, 2021

(87) PCT Pub. No.: WO2022/050596
PCT Pub. Date: Mar. 10, 2022

(65) Prior Publication Data
US 2022/0346256 A1 Oct. 27, 2022

(30) Foreign Application Priority Data
Sep. 3, 2020 (KR) .......................... 10-2020-0112212

(51) Int. Cl.
*H05K 5/02* (2006.01)
*H05K 5/00* (2006.01)

(52) U.S. Cl.
CPC ......... *H05K 5/0226* (2013.01); *H05K 5/0018* (2022.08)

(58) Field of Classification Search
CPC .... G06F 1/1681; G06F 1/1652; G06F 1/1616; G06F 1/1641; G06F 1/1618; H05K 5/0226; H05K 5/0018; H05K 5/03
See application file for complete search history.

(56) References Cited

U.S. PATENT DOCUMENTS

| | | | |
|---|---|---|---|
| 9,870,031 B2 * | 1/2018 | Hsu ........................ | G06F 1/1681 |
| 9,921,611 B2 * | 3/2018 | Wang .................... | G06F 1/1681 |
| 10,070,546 B1 * | 9/2018 | Hsu ....................... | E05D 11/1028 |
| 10,231,347 B2 * | 3/2019 | Seo ....................... | H05K 5/0013 |

(Continued)

FOREIGN PATENT DOCUMENTS

| | | |
|---|---|---|
| CN | 211083413 | 7/2020 |
| KR | 10-2014-0101274 | 8/2014 |

(Continued)

OTHER PUBLICATIONS

Search Report and Written Opinion dated Nov. 24, 2021 in counterpart International Patent Application No. PCT/KR2021/010857.

*Primary Examiner* — Abhishek M Rathod
(74) *Attorney, Agent, or Firm* — Nixon & Vanderhye, P.C.

(57) ABSTRACT

An electronic device according to various embodiments of the disclosure may include: a first housing; a second housing; a hinge module rotatably connecting the first housing and the second housing; a flexible display disposed to reach one surface of the second housing from one surface of the first housing across an area in which the hinge module is disposed; and a multi-bar assembly disposed between the first housing and the second housing, configured to be variable in response to rotational movement of the module, and supporting a bending area of the flexible display. The multi-bar assembly may include: a first bar and a second bar arranged side by side, each of the first bar and second bar forming at least one guide recess disposed at positions (Continued)

corresponding to each other; a first bar support bracket disposed under the first bar and including a first rail forming a curved shape and a first rail guide corresponding to the shape of the first rail; and a second bar support bracket disposed under the second bar and including a second rail forming a curved shape and a second rail guide corresponding to the shape of the second rail, the second bar support bracket being coupled to be rotatable and slidable with respect to the first bar support bracket. The first rail forming on the first bar support bracket may be configured to perform sliding movement along the second rail guide of the second support bracket located adjacent thereto, and at least a portion of the first rail may be insertable into the guide recess in the second bar through the sliding movement.

15 Claims, 22 Drawing Sheets

(56) References Cited

U.S. PATENT DOCUMENTS

| | | | | |
|---|---|---|---|---|
| 10,858,869 | B2* | 12/2020 | Chiang | E05D 3/18 |
| 11,003,217 | B2* | 5/2021 | Cha | G06F 1/1681 |
| 11,061,436 | B2* | 7/2021 | O'Neil | H04M 1/0216 |
| 11,553,612 | B2* | 1/2023 | Chen | H04M 1/022 |
| 2016/0370828 | A1* | 12/2016 | Hsu | G06F 1/1652 |
| 2017/0048996 | A1* | 2/2017 | Han | H05K 5/0217 |
| 2018/0092223 | A1* | 3/2018 | Hsu | G06F 1/1652 |
| 2020/0257335 | A1 | 8/2020 | Kim et al. | |

FOREIGN PATENT DOCUMENTS

| | | |
|---|---|---|
| KR | 10-2016-0032080 | 3/2016 |
| KR | 10-2016-0035146 | 3/2016 |
| KR | 10-2017-0022685 | 3/2017 |
| KR | 10-2020-0099054 | 8/2020 |
| WO | 2019/024046 | 2/2019 |

* cited by examiner

ELECTRONIC DEVICE INCLUDING FLEXIBLE DISPLAY

This application is the U.S. national phase of International Application No. PCT/KR2021/010857 filed 17 Aug. 2021, which designated the U.S. and claims priority to KR Patent Application No. 10-2020-0112212 filed 3 Sep. 2020, the entire contents of each of which are hereby incorporated by reference.

FIELD

The disclosure relates to an electronic device. For example, various embodiments relate to an electronic device including a foldable flexible display.

DESCRIPTION OF RELATED ART

With the development of electronic, information, and communication technologies, various functions are being integrated into one portable communication device or electronic device. For example, a smart phone includes functions of a sound reproduction device, an imaging device, and a digital diary, in addition to a communication function, and further various functions may be implemented in the smart phone through additional installation of applications.

Without being limited to the functions (e.g., applications) or information provided in a portable communication device or an electronic device itself, the user is capable of searching for and selectively acquiring more information by accessing a network. In accessing a network, a direct access method (e.g., wired communication) may provide fast and stable communication establishment, but a utilization area may be limited to a fixed location or a predetermined extent of space. In accessing a network, a wireless communication method has few restrictions on location or space, and the transmission speed and stability are gradually reaching the same level as the direct access method. In the future, it is expected that the wireless communication method will provide faster and more stable communication establishment than the direct access method.

As the use of personal or portable communication devices, such as smart phones, has become common, users' demands for portability and ease of use are increasing. For example, a touch screen display may provide a virtual keypad that replaces a mechanical input device (e.g., a button input device) while serving as an output device that outputs a screen (e.g., visual information). Accordingly, a portable communication device or an electronic device is capable of providing the same or further improved usability (e.g., a larger screen) while being miniaturized. On the other hand, with the commercialization of flexible, for example, foldable or rollable displays, the portability and ease of use of electronic devices are expected to further improve.

SUMMARY

In a foldable or rollable electronic device, it may be difficult to secure mechanical stability since the structures of the electronic device are implemented to move (e.g., slide, turn, or rotate) relative to each other. For example, it may be difficult to secure a stable operation structure while securing or maintaining portability of an electronic device through miniaturization and weight reduction.

In a general foldable or rollable electronic device, a structure of articulated bars may be used in order to support a display. In the structure of articulated bars, since rotation axes are disposed to overlap the display and are directly connected to each other with pins, the bezel area of the front surface of the electronic device may increase. Accordingly, there may be a limit in expanding the display.

Embodiments of the disclosure provide an electronic device in which different areas of a display are foldable to face away from each other or to face each other.

Embodiments of the disclosure provide an articulated multi-bar assembly for supporting a display. In the articulated multi-bar assembly, since a plurality of brackets rotate and slide with respect to each other and there is no separate pin for rotation, it is possible to reduce the bezel area of the electronic device.

Embodiments of the disclosure provide an electronic device capable of stably maintaining a folded or unfolded flexible display.

An electronic device according to various example embodiments of the disclosure may include: a first housing; a second housing; a hinge module rotatably connecting the first housing and the second housing to each other; a flexible display disposed to reach one surface of the second housing from one surface of the first housing across an area in which the hinge module is disposed; and a multi-bar assembly comprising a plurality of bars disposed between the first housing and the second housing, configured to be variable in response to rotational movement of the hinge module, and supporting a bending area of the flexible display. The multi-bar assembly may include: a first bar and a second bar arranged side by side, each of the first bar and the second bar forming at one guide recess such that the guide recesses are disposed at positions corresponding to each other; a first bar support bracket disposed under the first bar and including a first rail forming a curved shape and a first rail guide a shape corresponding to the shape of the first rail; and a second bar support bracket disposed under the second bar and including a second rail forming a curved shape and a second rail guide forming a shape corresponding to the shape of the second rail, the second bar support bracket being coupled to be rotatable and slidable with respect to the first bar support bracket. The first rail forming on the first bar support bracket may be configured to perform sliding movement along the second rail guide of the second support bracket located adjacent to the first bar support bracket, and at least a portion of the first rail may be insertable into the guide recess in the second bar through the sliding movement.

An electronic device according to various example embodiments of the disclosure may include: a first housing; a second housing; a hinge module rotatably connecting the first housing and the second housing to each other; a flexible display disposed to reach one surface of the second housing from one surface of the first housing across an area in which the hinge module is disposed; a plurality of bars arranged side by side between the first housing and the second housing, wherein adjacent bars are rotatable in response to rotational movement of the hinge module; a plurality of bar support brackets configured to guide rotational movement between the plurality of bars and including a rail having a curved shape and a rail guide having a shape corresponding to the shape of the rail; and an elastic sheet disposed to face a bending area of the flexible display and including attachment areas in contact with the plurality of bars and an elastic area disposed between the attachment areas to accommodate a change in length.

With an electronic device capable of being folded or unfolded according to various example embodiments (e.g., a foldable electronic device), it is possible to stably and simultaneously rotate a plurality of housings around hinge modules.

With a foldable electronic device according to various example embodiments, it is possible to expand the display area of the flexible display by stably supporting the flexible display and reducing the bezel area of the front surface of the electronic device.

With a foldable electronic device according to various example embodiments, it is possible to simplify assembly and to reduce costs using the articulated multi-bar assembly for stably supporting the flexible display and simplifying the configuration the articulated brackets of the articulated multi-bar assembly.

With a foldable electronic device according to various example embodiments, it is possible to use an articulated multi-bar assembly for stably supporting a flexible display and to position a rotation axis line connecting the rotation axes of the articulated brackets of the articulated multi-bar assembly near a neutral plane of the flexible display. Accordingly, there is no change in the length of the neutral plane even when the flexible display is bent, which makes it possible to suppress the degradation of surface quality.

With a foldable electronic device according to various example embodiments, it is possible to secure reliability and/or durability of the flexible display by disposing an elastic sheet capable of partially accommodating a length change between the flexible display and the multi-bar assembly.

The effects capable of being obtained by this disclosure are not limited to those described above, and other effects, which are not described above, may be clearly understood by a person ordinarily skilled in the technical field, to which this disclosure belongs, from the following description.

BRIEF DESCRIPTION OF THE DRAWINGS

The above and other aspects, features and advantages of certain embodiments of the present disclosure will be more apparent from the following detailed description, taken in conjunction with the accompanying drawings, in which.

DETAILED DESCRIPTION

Figure 1:
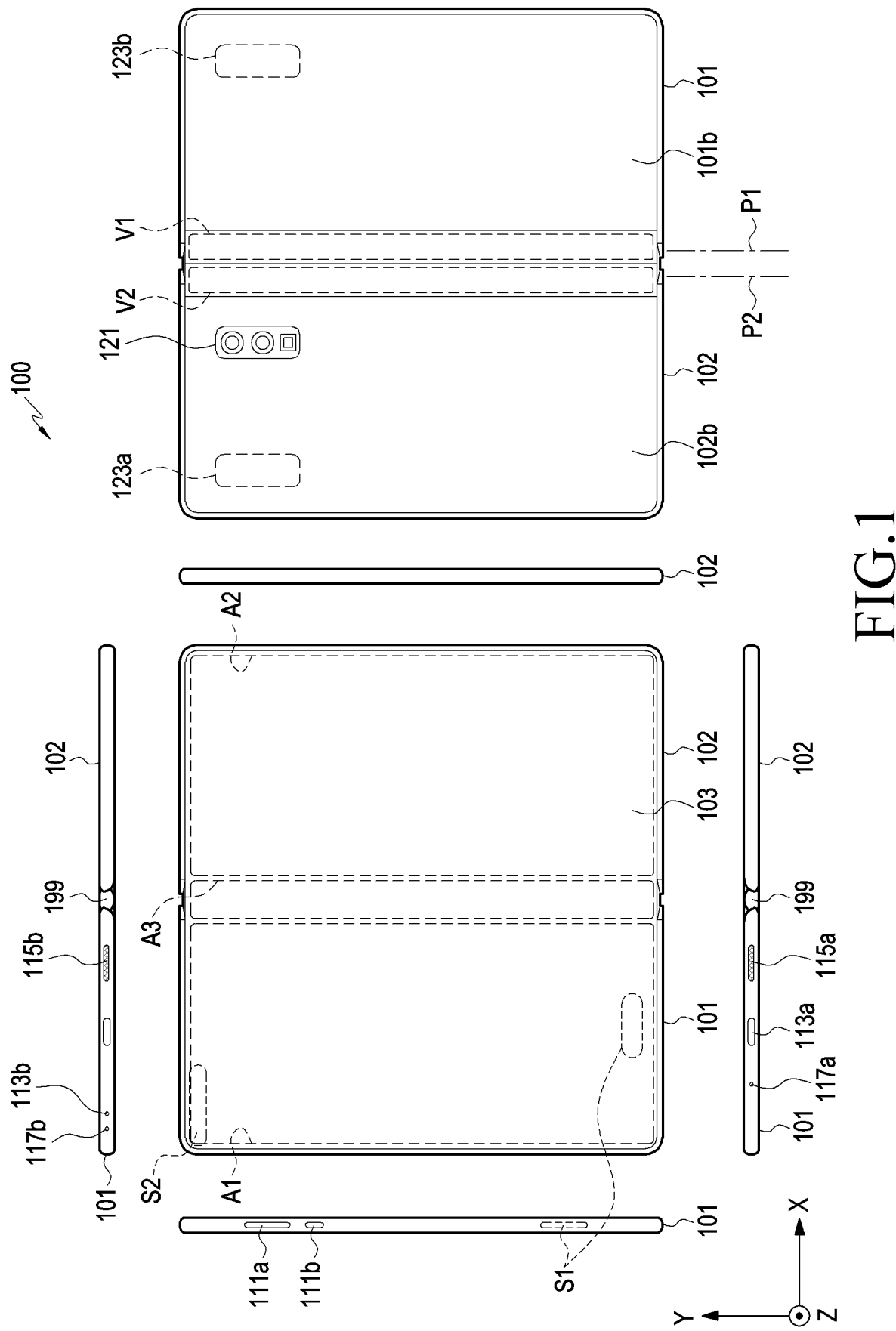
FIG. 1 is a diagram illustrating various example views of the unfolded state of an electronic device according to various embodiments.

The electronic device according to various embodiments may be one of various types of electronic devices. The electronic devices may include, for example, a portable communication device (e.g., a smart phone), a computer device, a portable multimedia device, a portable medical device, a camera, a wearable device, or a home appliance. The electronic device according to embodiments of the disclosure is not limited to those described above.

It should be appreciated that various embodiments of the disclosure and the terms used therein are not intended to limit the technological features set forth herein to particular embodiments and include various changes, equivalents, and/or alternatives for a corresponding embodiment. With regard to the description of the drawings, similar reference numerals may be used to designate similar or relevant elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "a first", "a second", "the first", and "the second" may be used to simply distinguish a corresponding element from another, and does not limit the elements in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), the element may be coupled with the other element directly (e.g., wiredly), wirelessly, or via a third element.

As used herein, the term "module" may include a unit implemented in hardware, software, or firmware, and may be interchangeably used with other terms, for example, "logic," "logic block," "component," or "circuit". The "module" may be a minimum unit of a single integrated component adapted to perform one or more functions, or a part thereof. For example, according to an embodiment, the "module" may be implemented in the form of an application-specific integrated circuit (ASIC).

Various embodiments as set forth herein may be implemented as software (e.g., program) including one or more instructions that are stored in a storage medium (e.g., internal memory or external memory) that is readable by a machine (e.g., electronic device). For example, a processor of the machine (e.g., electronic device) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each element (e.g., a module or a program) of the above-described elements may include a single entity or multiple entities. According to various embodiments, one or more of the above-described elements may be omitted, or one or more other elements may be added. Alternatively or additionally, a plurality of elements (e.g., modules or programs) may be integrated into a single element. In such a case, according to various embodiments, the integrated element may still perform one or more functions of each of the plurality of elements in the same or similar manner as they are performed by a corresponding one of the plurality of elements before the integration. According to various embodiments, operations performed by the module, the program, or another element may be carried out sequentially, in parallel, repeatedly, or heuristically, or one or more of the operations may be executed in a different order or omitted, or one or more other operations may be added.

Figure 2:
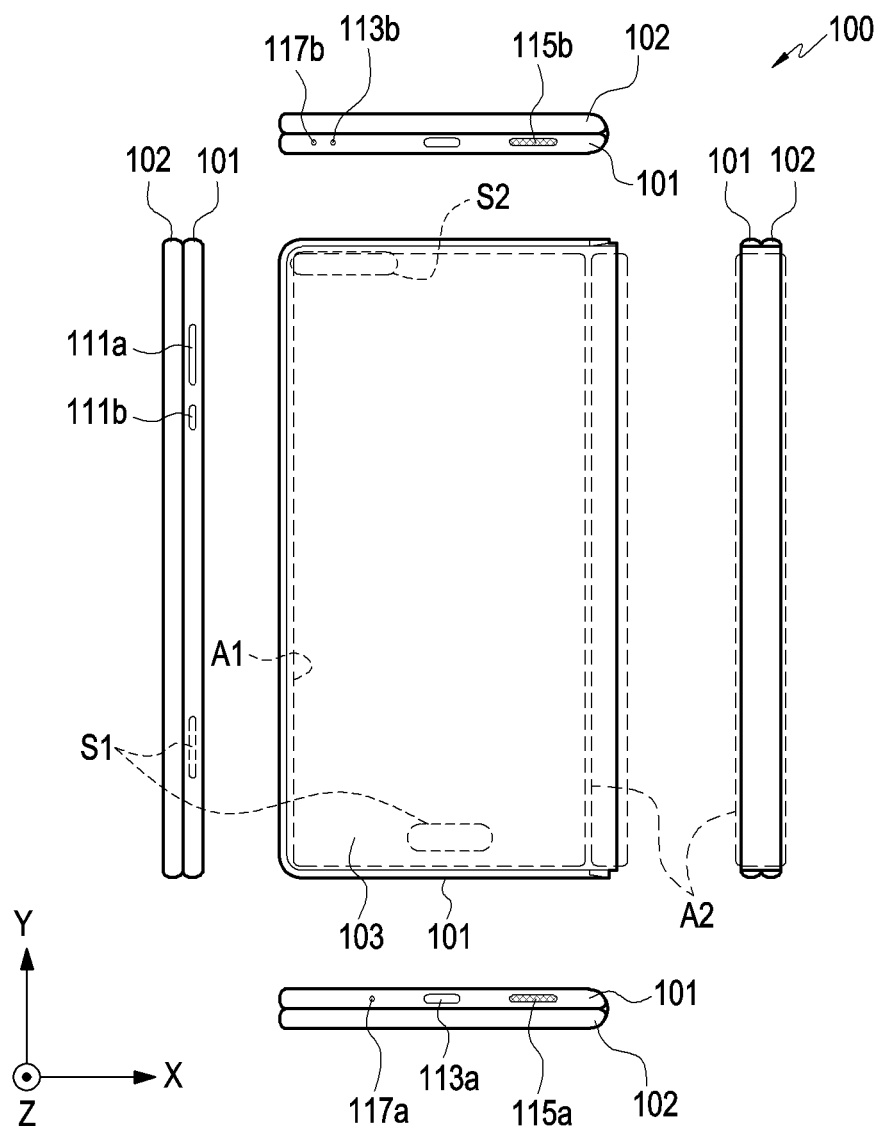
FIG. 2 is a diagram illustrating various example views of the folded state of the electronic device according to various embodiments.

FIG. 1 is a diagram illustrating an example electronic device in an unfolded state according to various embodiments. FIG. 2 is a diagram illustrating the electronic device in a folded state according to various embodiments.

In describing various example embodiments disclosed herein, a configuration in which a pair of housings (e.g., a first housing 101 and a second housing 102) are rotatably coupled to each other via a hinge module (e.g., the hinge module 204 of FIG. 3) may be illustrated. However, it is noted that this embodiment does not limit the electronic device 100 according to various embodiments disclosed herein. For example, the electronic device 100 according to various embodiments disclosed herein may include three or more housings, and "a pair of housings" in the embodiments disclosed below may refer to "two housings rotatably coupled to each other among three or more housings".

In the following detailed description, reference may be made to "+X/−X direction", "+Y/−Y direction" or "+Z/−Z direction", and it is noted that the Cartesian coordinate system to be described later is generally described with reference to the width direction X, the length direction Y, or the thickness direction Z of the first housing 101 in FIG. 1 or 2. For example, according to an embodiment or when another structure of the electronic device 100 is set as a reference, the above definition of directions may be variously changed. In addition, in the following detailed description, the "front surface" or "rear surface" of the electronic device 100 or the housings 101 and 102 may be referred to, in which, irrespective of a relative position (e.g., an unfolded state or a folded state) of the housings 101 and 102, the surface on which the flexible display 103 of FIG. 1 is disposed is defined as the "front surface" of the electronic device 100 (or the housings 101 and 102), and a surface facing away from the surface on which the flexible display 103 is disposed is defined as the "rear surface" of the electronic device 100 (or the housings 101 and 102).

Referring to FIGS. 1 and 2, the electronic device 100 may include a pair of housings 101 and 102, a flexible display 103, and a hinge module (e.g., the hinge modules 204 in FIG. 3) that rotatably connects the housings 101 and 102. The electronic device 100 may further include a hinge cover(s) 199 disposed on the upper end and/or the lower end. The hinge cover(s) 199 may be disposed substantially between the first housing 101 and the second housing 102, and may block the hinge module 204 from being visible to the outside. In an embodiment, the hinge cover(s) 199 may isolate an internal space of the electronic device 100 from an external space. In various embodiments, the hinge cover(s) 199 may be visible to the outside in the state in which the electronic device 100 is unfolded, and may be visually hidden in the folded state of the electronic device 100.

According to various embodiments, as illustrated in FIG. 1, in the state in which the electronic device 100 (e.g., the first housing 101 and the second housing 102) is unfolded, the flexible display 103 may output a screen substantially in one direction (e.g., the +Z direction) through the entire area thereof. As illustrated in FIG. 2, in the state in which the electronic device 100 is folded, a first area A1 of the flexible display 103 is oriented in the +Z direction, and a second area A2 of the flexible display 103 is oriented in the −Z direction. For example, the flexible display 103 may include areas (e.g., the first area A1 and the second area A2) arranged to face opposite directions in the state in which the electronic device 100 is folded. For example, the first housing 101 and the second housing 102 may be rotated between a position in which the first and second housings are unfolded so as to be arranged side by side and a position in which the first and second housings are folded to face each other. According to an embodiment, the flexible display 103 may include a folding area A3, and in the folded state of the electronic device 100, the folding area A3 may be disposed to substantially face the +X direction. For example, in the state in which the first housing 101 and the second housing 102 are folded to face each other, the flexible display 103 may be visible to the outside.

Figure 3:
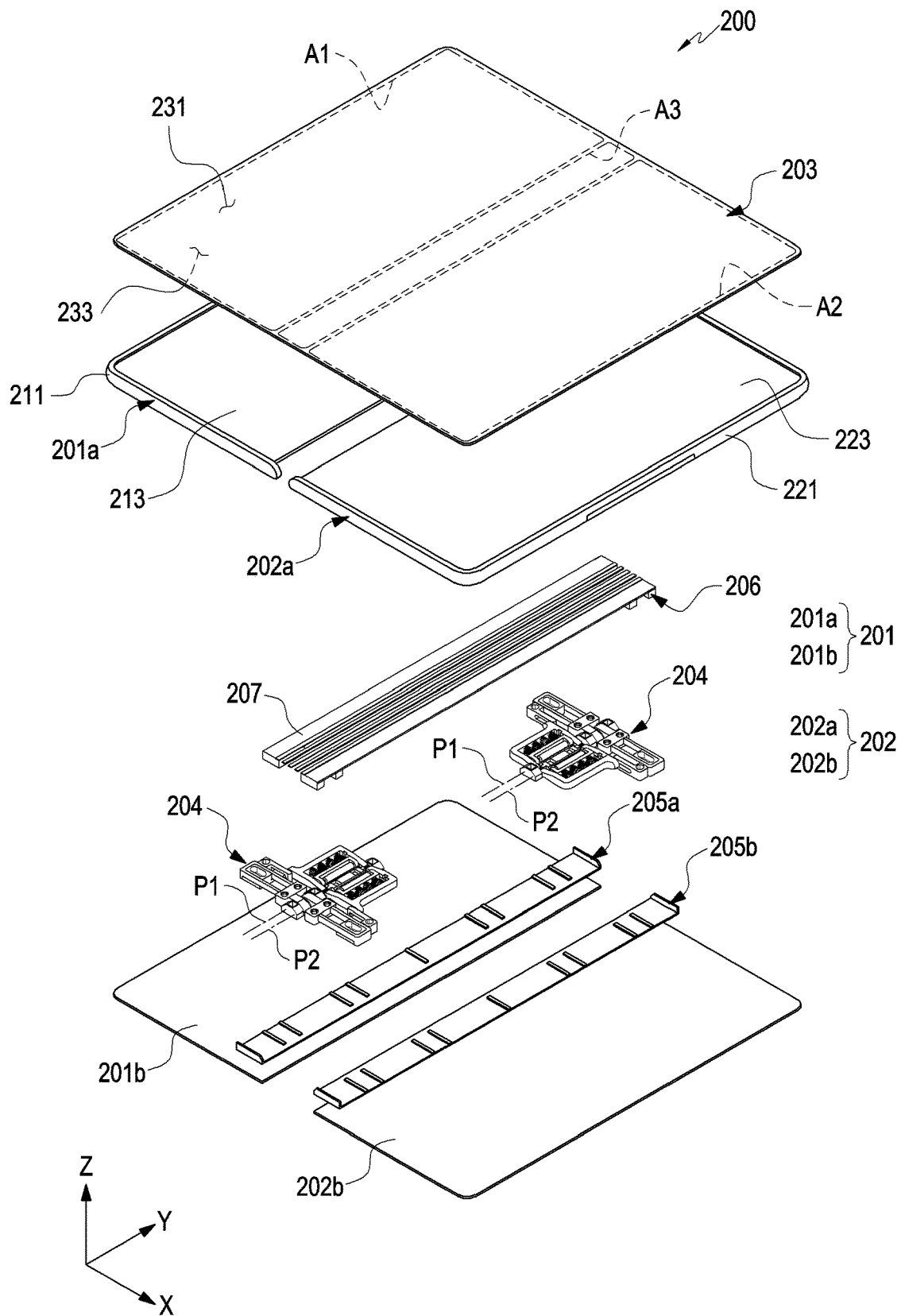
FIG. 3 is an exploded perspective view illustrating an electronic device according to various embodiments.

According to various embodiments, the first housing 101 and/or the second housing 102 may accommodate the flexible display 103 on the front surfaces thereof, and may include rear plates 101b and 102b (e.g., the first rear plate 201b and the second rear plate 202b in FIG. 3) disposed on the rear surfaces thereof. The electronic device 100 may include a plurality of electrical components disposed in the space between the flexible display 103 and the rear plates 101b and 102b (e.g., a circuit board, various sensor modules, a battery, a sound input/output module, a camera module, a haptic module, an antenna, and/or a connection terminal). The first housing 101 may be coupled to the hinge module 204 to be rotatable about a first rotation axis P1, and the second housing 102 may be coupled to the hinge module 204 to be rotatable about a second rotation axis P2. In various embodiments, the first housing 101 and the second housing 102 may be disposed to be substantially symmetrical to each other about the hinge module 204. In an embodiment, when the first housing 101 rotates about the hinge module 102, the second housing 102 may rotate in a direction reverse to that of the first housing 101 so that the electronic device can be folded or unfolded.

According to various embodiments, the flexible display 103 may include a first area A1 disposed on one surface of the first housing 101, a folding area A3 disposed to correspond to the hinge module 204, and/or a second area A2 disposed on one surface of the second housing 102. For example, the flexible display 103 may be disposed or extended from one surface of the first housing 101 across an area in which the hinge module 204 is disposed to reach one surface of the second housing 102. In fact, the first area A1 may be fixed to the first housing 101, the second area A2 may be fixed to the second housing 102, and/or the folding area A3 may be supported by the multi-bar assembly (e.g., the multi-bar assembly 206 in FIG. 3). For example, the multi-bar assembly 206 may be disposed between the first housing 101 and the second housing 102 on the front surface of the electronic device 100 so as to support the flexible display 103 (e.g., the folding area A3). In an embodiment, the flexible display 103 may output a screen through an area substantially corresponding to the total area of the front surface of the electronic device 100.

According to various embodiments, the width measured from the side surface of the first housing 101 to the side surface of the second housing 102 in the X-axis direction in the unfolded state across the position at which the hinge module 204 is disposed may be substantially the same on the front surface of the electronic device 100 (e.g., the flexible display 103) and the rear surface of the electronic device 100. The width measured from the side surface of the first housing 101 to the side surface of the second housing 102 in the X-axis direction in the folded state across the position at which the hinge module 204 is disposed may be smaller on the rear surface of the electronic device 100 than on the front surface of the electronic device 100 (e.g., the flexible display 103). The first area A1 and the second area A2 of the flexible display 103 are fixed to the first housing 101 and the second housing 102 and the width measured in the X-axis direction cannot be substantially changed in the flexible display 103. Thus, the width measured in the X-axis direction on the rear surface of the electronic device 100 is changeable. For example, it is possible to implement a change in width measured in the X-axis direction on the rear surface of the electronic device 100 by causing a partial area (e.g., the area indicated by "V1" and/or the area indicated by "V2") on the rear surface of the electronic device 100 to contract or expand. In an embodiment, it is possible to implement a change in width measured in the X-axis direction on the rear surface of the electronic device 100 through the sliding movement of the first housing 101 and/or the second housing 102 relative to the hinge module 204. In an embodiment, when the first housing 101 and/or the second housing 102 slide relative to the hinge module 204 and the area indicated by "V1" and/or the area indicated by "V2" contract or expand on the rear surface of the electronic device 100 to correspond to the sliding movement of the first housing 101 and/or the second housing 102, the width measured in the X-axis direction is changeable.

According to various embodiments, the change in length of the rear surface of the electronic device 100 according to the unfolding or folding operation may be variously achieved. In various embodiments, the change in the length of the rear surface of the electronic device 100 according to an unfolding or folding operation may be proportional to the distance between the flexible display 103 and the rear surface of the electronic device 100. For example, as the thickness of the electronic device 100 measured in the Z direction increases, the change in the length of the rear surface of the electronic device 100 according to the unfolding or folding operation may increase.

According to various embodiments, the electronic device 100 (e.g., the first housing 101 and/or the second housing 102) may include at least one sensor area S1 or S2 provided with at least one sensor module. For example, the electronic device 100 may include a first sensor area S1 provided on the front or side surface of the first housing 101 and/or a second sensor area S2 provided on the front surface of the first housing 101. In the first sensor area S1, for example, a fingerprint recognition sensor may be disposed. The fingerprint recognition sensor may include, for example, an optical fingerprint recognition sensor or an ultrasonic fingerprint recognition sensor, and may be disposed on the side surface of the first housing 101 (or the second housing 102) or inside the flexible display 103. The electronic device 100 may include a sensor module provided in the second sensor area S2, for example, at least one of a camera module, a proximity sensor, an illuminance sensor, an iris recognition sensor, an ultrasonic sensor, and an indicator. In the second sensor area S2, the sensor module(s) may be disposed inside the flexible display 103.

According to various embodiments, the electronic device 100 may include a notch portion protruding from the second sensor area S2 to the first area A1 of the flexible display 103. The notch portion may be a structure of the first housing 101 (or the second housing 102), and at least some of the sensor modules may be disposed in the notch portion. The notch portion may have a polygonal shape, a circular shape, or an elliptical shape. In an embodiment, in the second sensor area S2, the flexible display 103 may include a transparent area that allows external light to be incident therein. For example, among the sensor modules, an optical sensor, such as a camera module or a proximity sensor, may be disposed to correspond to the transparent area of the flexible display 103. The electronic device 100 (e.g., the sensor areas S1 and S2 or the sensor module) according to various embodiments disclosed herein is not limited to the above-described configuration. Depending on functions provided in the electronic device 100 or functions of respective sensor modules mounted in the electronic device 100, the electronic device 100 may further include an additional sensor area or an additional sensor module. In various embodiments, the electronic device 100 may not include some of the above-mentioned sensor modules.

According to various embodiments, the electronic device 100 may include a camera module 121 disposed on the rear surface thereof (e.g., the rear surface of the second housing 102). In various embodiments, the camera module 121 may be interpreted as one of sensor modules, and may include a plurality of cameras, at least one infrared projector, at least one infrared receiver, or a flash. The user may photograph a subject using the camera module 121 provided on the rear surface of the electronic device 100 (e.g., the second housing 102). In an embodiment, the camera module 121 may be disposed at another position, for example, a position indicated by reference numeral "123a" or "123b", and the electronic device 100 may further include an additional camera module or sensor module at a position different from the positions indicated in FIG. 1.

According to various embodiments, the electronic device 100 may include one or more key input devices 111a and 111b disposed on a side surface of the first housing 101 (and/or the second housing 102). The key input devices 111a and 111b may include, for example, a volume control key 111a and/or a power key 111b, and the illustrated key input devices 111a and 111b may be omitted or an additional key input device may be provided according to an embodiment. In various embodiments, the electronic device 100 may further include a soft key provided through the flexible display 103.

According to various embodiments, the electronic device 100 may include one or more connector holes 113a and 113b disposed in a side surface (e.g., a side surface, an upper surface, and/or a lower surface of the first housing 101 and/or the second housing 102). The connector holes 113a and 113b may include, for example, a first connector hole 113a for connecting a charging/data cable, and a second connector hole 113b for connecting a sound device (e.g., earphone). In various embodiments, the data cable may refer to a cable provided to the sound device. For example, the second connector hole 113b may be omitted from the electronic device 100, and the electronic device 100 may be connected to the sound device via the first connector hole 113a. In an embodiment, the electronic device 100 may not include the connector holes 113a and 113b. For example, the electronic device 100 may include functions such as wireless charging, Bluetooth communication, wireless fidelity (Wi-Fi) direct, or infrared data association (IrDA) so as to be connected to another electronic device or an additional device, such as an earphone, in a wireless manner.

According to various embodiments, the electronic device 100 may include a plurality of sound output holes 115a and 115b and a plurality of sound input holes 117a and 117b. In the illustrated embodiment, the sound output holes 115a and 115b may be disposed at the upper end and the lower end of the first housing 101 (and/or the second housing 102), respectively. In an embodiment, the sound output holes 115a and 115b may be disposed in the side surface of the first housing 101 and the side surface of the second housing 102, respectively. The sound input holes 117a and 117b may be disposed at the upper and lower ends of the electronic device 100 (e.g., the first housing 101), respectively. The electronic device 100 may perform, in a voice call or sound recording mode, functions, such as a sound beam forming function, an active noise canceling (ANC) function, an echo canceling (EC) function, a noise suppression (NS) function, and/or a feedforward (FF) function by acquiring external sound through the plurality of sound input holes 117a and 117b. In various embodiments, a sound input hole (not illustrated) may be further disposed in the rear surface of the first housing 101 (and/or the second housing 102). The electronic device 100 may acquire, in a photographing mode, external sound through the sound input hole disposed in the rear surface of the first housing 101. As the number and oriented directions of the sound input holes 117a and 117b increase, the electronic device 100 is capable of providing improved performance in terms of the sound beam forming function, the active noise canceling (ANC) function, the echo canceling (EC) function, the noise suppression (NS) function and/or feedforward (FF) function.

According to various embodiments, in the unfolded state, the first housing 101 and the second housing 102 may be disposed to form a predetermined angle with respect to each other, for example, 180 degrees. When the electronic device 100 is unfolded to a predetermined angle, the flexible display 103 may output a screen in the +Z direction through substantially the entire area. In various embodiments, the first housing 101 and the second housing 102 may be unfolded in an inclined form between a folded position facing each other and a predetermined angular position. In the state of being unfolded in an inclined form, the first area A1 and the second area A2 of the flexible display 103 may output screens in different directions. For example, when unfolded in an inclined form, the electronic device 100 may provide a screen to two users who sit facing each other. When the electronic device 100 outputs a screen in the state of being unfolded in an inclined form, the screen output from the first area A1 and the screen output from the second area A2 may be the same or different from each other.

According to various embodiments, in the folded state, the flexible display 103 may be substantially visible to the outside. For example, the electronic device 100 may output a screen using the first area A1, the second area A2, and/or the folding area A3. In various embodiments, in the standby mode, the electronic device 100 may deactivate the screen of the flexible display 103 and may activate a partial area according to predetermined setting. For example, in the standby mode, the electronic device 100 may at least partially activate the first area A1 to output daily information, such as time or weather. According to an embodiment, in the standby mode, the electronic device 100 may activate at least one of the first area A1, the second area A2, and/or the folding area A3 so as to provide visual information about the operating state or display notification information, such as messages or news.

According to various embodiments, the radius of curvature of the folding area A3 of the flexible display 103 may vary while the electronic device 100 is being folded or unfolded. For example, as the electronic device 100 is gradually unfolded from the folded state, the radius of curvature of the folding area A3 may gradually increase. In the folding or unfolding operation, the electronic device 100 may adjust a screen output through the folding area A3. For example, by adjusting the aspect ratio of the screen in the folding area A3 according to the change in the radius of curvature, the electronic device 100 may compensate for the distortion of the output screen due to the deformation of the folding area A3.

Figure 4:
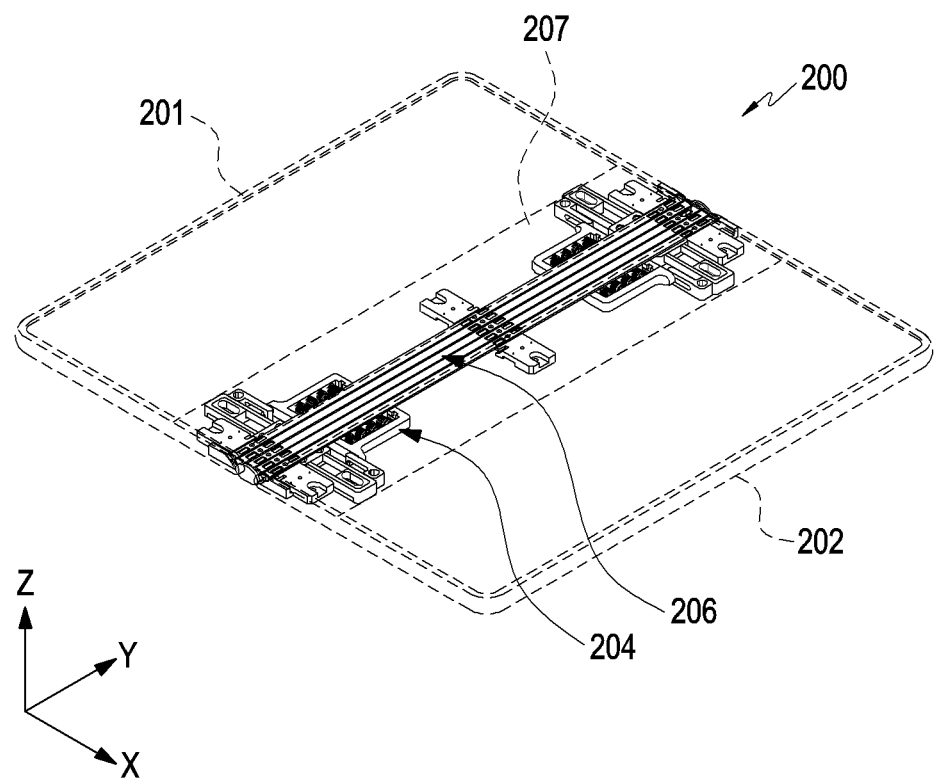
FIG. 4 is a perspective view illustrating a structure in which a first housing and a second housing are connected to each other in an electronic device according to various embodiments.

FIG. 3 is an exploded perspective view illustrating an electronic device 200 (e.g., the electronic device 100 in FIG. 1 or FIG. 2) according to various embodiments. FIG. 4 is a partial perspective view illustrating a structure in which the first housing 201 and the second housing 202 are connected to each other in the electronic device 200 (e.g., the electronic device 100 in FIG. 1 or FIG. 2) according to various embodiments.

Referring to FIGS. 3 and 4, the electronic device 200 (e.g., the electronic device 100 of FIG. 1 or FIG. 2) may include a first housing 201 (e.g., the first housing 101 in FIG. 1 or FIG. 2), a second housing 202 (e.g., the second housing 102 of FIG. 1 or FIG. 2) rotatably connected to the first housing 201, at least one hinge module 204 rotatably connecting the first housing 201 and the second housing 202 to each other, and/or a flexible display 203 (e.g., the flexible display 103 of FIG. 1 or FIG. 2). The flexible display 203 may be disposed to reach one surface (e.g., the front surface) of the second housing 202 from one surface (e.g., the front surface) of the first housing 201 across the area in which the hinge module 204 is disposed.

According to various embodiments, the first housing 201 may include a first housing member 201a and a first rear plate 201b coupled to the first housing member 201a. The second housing 202 may include a second housing member 202a and a second rear plate 202b coupled to the second housing member 202a. The first housing 201 and the second housing 202 may have substantially the same structure, and may be partially different from each other according to electrical components disposed on each of the housings. For example, when the camera module 121 of FIG. 1 is disposed in one of the first housing 201 and the second housing 202, the shapes of the first housing 201 and the second housing 202 (e.g., the first rear plate 201b and the second rear plate 202b) or the mechanical structures of the first housing member 201a and the second housing member 202a may be slightly different from each other. The difference between the first housing 201 and the second housing 202 may vary depending on an actually manufactured product.

According to various embodiments, the first housing member 201a substantially forms the exterior of the electronic device 200 (e.g., the first housing 201), and may include a first side bezel structure 211 and a first support plate 213. The first side bezel structure 211 may have a frame shape that defines a side surface (e.g., the left side surface in FIG. 1), an upper surface, and/or a lower surface of the first housing 101, and may be open in a direction adjacent to the second housing 202. According to an embodiment, the first side bezel structure 211 may include a metal and/or a polymer, and may be electrically connected to a processor or a communication module of the electronic device 200 according to an embodiment. For example, the first side bezel structure 211 may function as an antenna of the electronic device 200 by at least partially including a metal and/or an electrically conductive material. In various embodiments, the first side bezel structure 211 may provide a decorative effect on the exterior of the electronic device 200 or provide an electrically insulating structure by including various coating layers.

According to various embodiments, the first support plate 213 may be disposed in the space between the flexible display 203 and the first rear plate 201b and may be connected to the first side bezel structure 211. In various embodiments, the first support plate 213 may be integrated with the first side bezel structure 211, and may include the same material as the first side bezel structure 211, for example, a metal and/or a polymer. In an embodiment, the first support plate 213 may provide an electromagnetic shielding structure inside the electronic device 200 by including a metal and/or a conductive material. In an embodiment, the first support plate 213 may function as a ground conductor providing a reference potential inside the electronic device 200 by including a metal and/or a conductive material. In various embodiments, a flexible display 203 (e.g., the first area A1) may be positioned on the outer surface of the first support plate 213.

According to an embodiment, the first rear plate 201b may be made of, for example, coated or colored glass, ceramic, a polymer, a metal (e.g., aluminum, stainless steel (STS), or magnesium), or a combination of at least two of above-mentioned materials. In various embodiments, the first rear plate 201b may be substantially integrated with the first housing member 201a (e.g., the first side bezel structure 211). In an embodiment, at least a portion of the first rear plate 201b may include a curved area. For example, an edge portion of the first rear plate 201b adjacent to the first side bezel structure 211 may be bent towards the front surface of the electronic device 200 (e.g., the surface on which the flexible display 203 is disposed) so as to include a seamlessly extending portion. In an embodiment, the first rear plate 201b may be disposed to be inclined with respect to the first area A1 of the flexible display 203. For example, when the edge of the first rear plate 201b adjacent to the second housing 202 is located at a first height from the first area A1 of the flexible display 203, the end of the first rear plate 201b in the −X direction may be located at a second height lower than the first height.

According to various embodiments, the space between the first support plate 213 and the first rear plate 201b may be at least partially surrounded by the first side bezel structure 211. Although not illustrated, in the space between the first support plate 213 and the first rear plate 201b, the electronic device 200 may accommodate various electric components, such as a printed circuit board, a battery, a haptic module, a camera module, a sensor module(s) and/or a connection terminal. For example, the first support plate 213 may be used as a structure that prevents and/or reduces other electrical components of the electronic device 200 from coming into contact with the flexible display 203. Some of the electrical components accommodated in the electronic device 200, for example, a camera module (e.g., the camera module 121 in FIG. 1) may be partially exposed to the external space. Here, the description "exposed to the external space" may refer to including a configuration that is isolated from the external space but is visible and/or a configuration that is exposed so that a user is capable of directly touching it. On the printed circuit board, a processor, a memory and/or an interface may be located.

The processor may include various processing circuitry including, for example, and without limitation, at least one of a central processing unit, an application processor, a graphics processor, an image signal processor, a sensor hub processor, or a communication processor, or the like. The battery is a device for supplying power to at least one component of the electronic device 200, and may include, for example, a non-rechargeable primary battery, a rechargeable secondary battery, or a fuel cell. At least a portion of the battery may be disposed, for example, between the first support plate and the first rear plate to be substantially flush with the printed circuit board. The battery may be integrally disposed inside the electronic device 200, or may be detachably disposed on the electronic device 200.

According to various embodiments, an additional support plate and/or an antenna (not illustrated) may be provided in the space between the first support plate 213 and the first rear plate 201*b*. The additional support plate may improve the mechanical rigidity of the electronic device 200, and may provide an electromagnetic shielding structure between electrical components inside the electronic device 200. The antenna may be disposed between the first support plate 213 (and/or an additional support plate (not illustrated)) and the first rear plate 201*b*. The antenna may perform short-range communication with an external device or wirelessly transmitting and receiving power required for charging by including, for example, a near field communication (NFC) antenna, a wireless charging antenna, and/or a magnetic secure transmission (MST) antenna. In an embodiment, the antenna structure may include a part of the first side bezel structure 211 and/or the first support plate 213 or a combination thereof.

According to various embodiments, the second housing 202 may include a second housing member 202*a* (e.g., the second side bezel structure 221 and a second support plate 223) and a second rear plate 202*b*, and may have a structure similar to the structure of the first housing 201. Therefore, a detailed description thereof will be omitted. In various embodiments, as described above, the electrical components disposed in the first housing 201 and/or the second housing 202, such as the key input devices 111*a* and 111*b* of FIG. 1, the sensor areas S1 and S2, and/or the camera modules 121 may be different from each other. Thus, the second housing 202 may be partially different from the first housing 201 in shape or structure.

According to various embodiments, the hinge module 204 may rotatably couple the second housing 202 to the first housing 201. According to an embodiment, the first housing 201 may be coupled to the hinge module 204 to be rotatable about the first rotation axis P1, and the second housing 202 may be coupled to the hinge module 204 to be rotatable about the second rotation axis P2. For example, the first housing 201 and the second housing 202 may be folded by rotating in the opposite direction with respect to each other in the unfolded state. In the folded state, the first housing 201 and the second housing 202 may be rotated in opposite directions with respect to each other to be unfold to a predetermined or specified angle. Here, the "predetermined angle" may refer, for example, to an angle of 180 degrees.

According to various embodiments, the hinge module 204 may link the rotation of the second housing 202 with the rotation of the first housing 201. For example, when the first housing 201 rotates in the first direction (e.g., clockwise when viewed from the state illustrated in FIG. 3) about the first rotation axis P1, the hinge module 204 may rotate the second housing 202 in a second direction (e.g., counter-clockwise when viewed in the state illustrated in FIG. 3) that is opposite to the first direction. According to an embodiment, the hinge module 204 may provide a friction force when the first housing 201 and/or the second housing 202 rotate. For example, when the user applies an external force to a certain extent, the hinge module 204 may allow the first housing 201 and/or the second housing 202 to rotate, and when the external force is not applied, the hinge module 204 may maintain the first housing 201 and/or the second housing 202 in the stationary state. In an embodiment, the hinge module 204 may maintain the first housing 201 and/or the second housing 202 at a predetermined angular position (e.g., a folded 0 degree angular position, an unfolded 180 degree angular position and/or a position unfolded in an inclined form at an angle of about 120 degrees to 160 degrees) in a stationary state using a detent structure.

According to various embodiments, the flexible display 203 may include a display panel 231 and a display protection layer 233. The display panel 231 may include a light-emitting layer disposed between transparent substrates, and the transparent substrates may include electric circuits such as a touch sensor. For example, the display panel 231 may be made of, for example, an organic-light emitting diode (OLED) or a micro LED to output visual information, and to detect the user's direct contact with the display panel 231 or the user's motion performed within a predetermined distance from the display panel 231. The display protection layer 233 may attach the display panel 231 to the first housing 201 and/or the second housing 202, and may be made of an elastic material so as to be used as a cushioning material between the display panel 231 and mechanical structures (e.g., the first housing 201 and/or the second housing 202).

According to various embodiments, the flexible display 203 may include a first area A1 mounted on or fixed to the first housing 201, a second area A2 located in the second housing 202, and a folding area A3 connecting the first area A1 and the second area A2. The folding area A3 is disposed to substantially correspond to the area in which the hinge module 204 is disposed, and may be deformed into a flat shape or a curved shape while the electronic device 200 (e.g., the electronic device 100 in FIG. 1 or FIG. 2) is being folded or unfolded. In the state in which the electronic device 200 is unfolded, the flexible display 203 may output a screen in one direction using substantially the entire area. In the state in which the electronic device 200 is folded, the flexible display 203 may output screens in different directions using the first area A1 and the second area A2.

According to various embodiments, the electronic device 200 may further include a first slide plate 205*a* and a second slide plate 205*b*. The first slide plate 205*a* may be located on the first housing member 201*a* (e.g., the first support plate 213), and a portion of the hinge module 204 may be slidably coupled between the first support plate 213 and the first slide plate 205*a*. The second slide plate 205*b* may be located on the second housing member 201*a* (e.g., the second support plate 223), and a portion of the hinge module 204 may be slidably coupled between the second support plate 223 and the second slide plate 205*b*. For example, the first slide plate 205*a* and the second slide plate 205*b* couple the first housing 201 and/or the second housing 202 to the hinge module 204 so as to guide or support the sliding movement of the first housing 201 and/or the second housing 202. According to an embodiment, the first slide plate 205*a* and/or the second slide plate 205*b* may not be included in the electronic device 200.

According to various embodiments, the electronic device 200 (e.g., the electronic device 100 in FIG. 1 or FIG. 2) may further include a multi-bar assembly 206 and an elastic sheet 207 disposed between the flexible display 203 and the multi-bar assembly 206 so as to support the flexible display 203. The multi-bar assembly 206 may be disposed to correspond to an area in which the hinge module 204 is disposed, and may connect the first support plate 213 and the second support plate 223 to each other. For example, the multi-bar assembly 206 and the elastic sheet 207 may be disposed to support the folding area A3 of the flexible display 203. In an embodiment, the multi-bar assembly 206 may include a plurality of (e.g., five) bars or rods extending in one direction. The bars or rods of the multi-bar assembly 206 may, for example, have a circular, oval, or polygonal cross section, and are disposed parallel to the longitudinal direction Y of the electronic device 200, for example, the rotation axis P1 or P2. In an embodiment, the plurality of bars or rods may be arranged in the width direction of the electronic device 200 (X-axis direction) to be rotatably connected to other adjacent bars or rods. By rotating the bars or rods with respect to other adjacent bars or rods, the multi-bar assembly 206 may be deformed into a flat plate shape and/or a curved shape. For example, when the electronic device 200 is folded or unfolded, the multi-bar assembly 206 and the elastic sheet 207 are capable of supporting the folding area A3 of the flexible display 203 while being deformed to correspond to the folding area A3. In the state in which the electronic device 200 is unfolded, when there is a contact of an external object or a user contact on the folding area A3, the multi-bar assembly 206 is capable of supporting the folding area A3 to suppress the deformation of the folding area A3.

Figure 5:
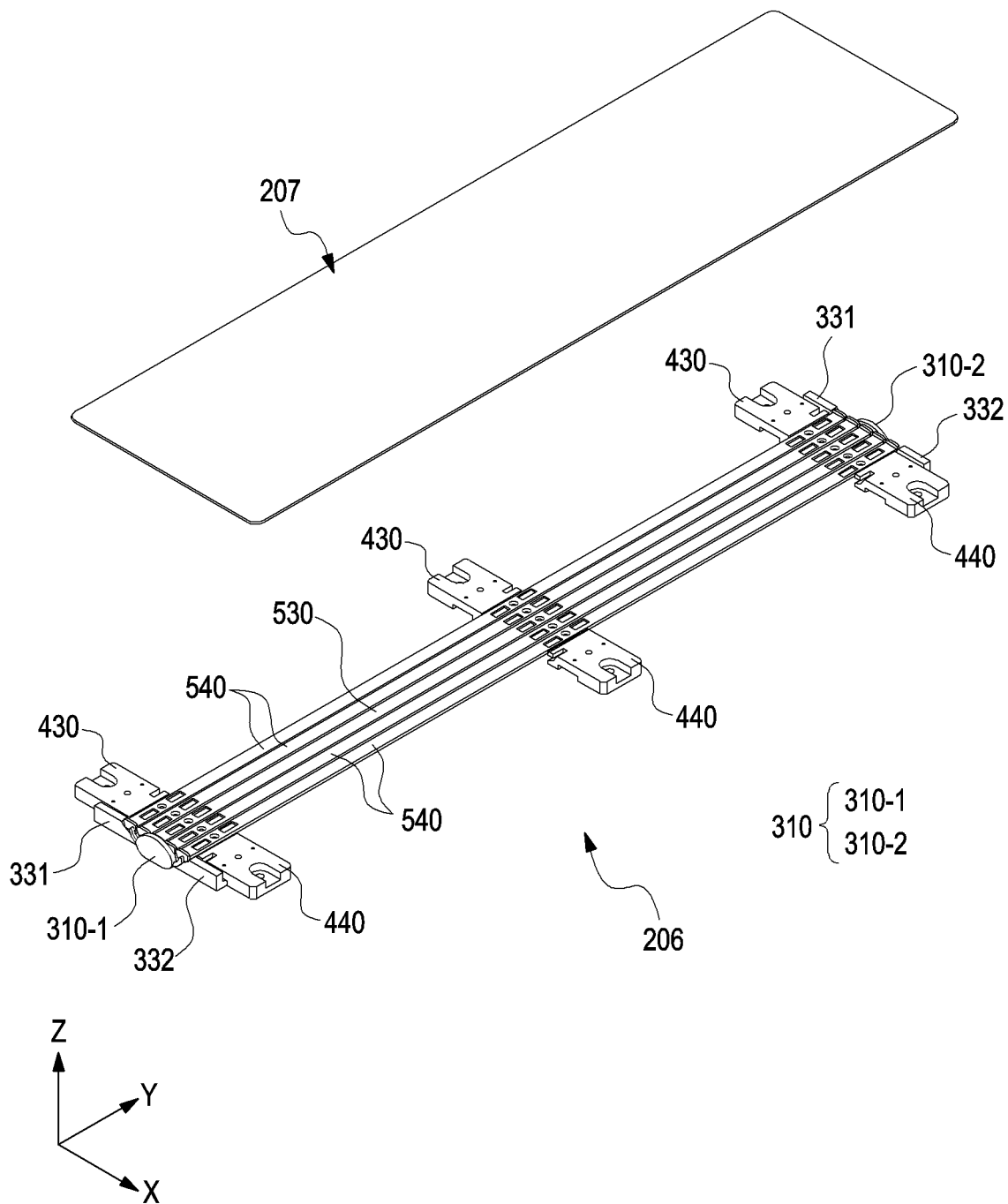
FIG. 5 is an exploded perspective view illustrating a multi-bar assembly and an elastic sheet in an electronic device according to various embodiments.
Figure 6:
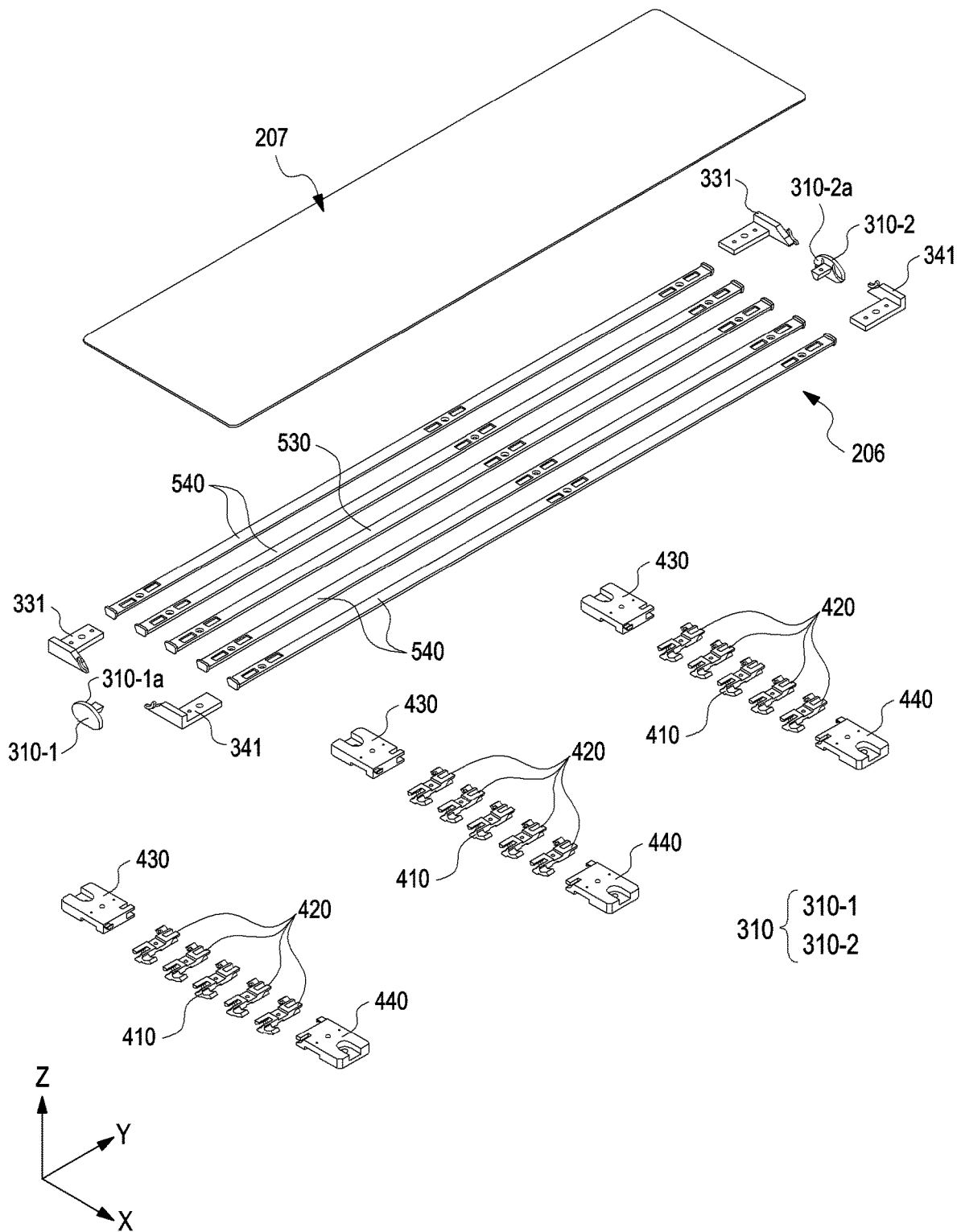
FIG. 6 is an exploded perspective view illustrating a multi-bar assembly in an electronic device according to various embodiments.

FIG. 5 is an exploded perspective view illustrating an example multi-bar assembly (e.g., the multi-bar assembly 206 in FIGS. 3 and 4) and an elastic sheet 207 in an electronic device (e.g., the electronic device 200 in FIGS. 3 and 4) according to various embodiments. FIG. 6 is an exploded perspective view illustrating the multi-bar assembly (e.g., the multi-bar assembly 206 in FIGS. 3 and 4) in an electronic device (e.g., the electronic device 200 in FIGS. 3 and 4) according to various embodiments.

Referring to FIGS. 5 and 6, the multi-bar assembly 206 is connected to the hinge module 204 to be variable on the basis of the movement of the hinge module 204. The elastic sheet 207 may be disposed on the multi-bar assembly 206 to be variable in response to the variable operation of the multi-bar assembly 206. The multi-bar assembly 206 may include a center bar 530 and multi-bars 540. The configurations of the center bar 530 and the multi-bars 540 of FIGS. 5 and 6 may be entirely or partially the same as the configurations of the bars or rods of the multi-bar assembly 206 of FIGS. 3 and 4.

According to various embodiments, the center bar 530 may support a flexible display (e.g., the flexible display 203 in FIGS. 3 and 4) together with the multi-bars 540. According to an embodiment, the center bar 530 may be connected to the hinge cover 310. For example, the center bar 530 may be inserted into a groove located in a protruding area of the hinge cover 310. According to an embodiment, the center bar 530 may be disposed between a first rotation axis (e.g., the first rotation axis P1 in FIG. 3) and a second rotation axis (e.g., the second rotation axis P2 in FIG. 3).

According to an embodiment, the center bar 530 may be connected to a plurality of hinge covers 310. For example, one end of the center bar 530 may be connected to a first hinge cover 310-1 and the other end may be connected to a second hinge cover 310-2. According to an embodiment, the first hinge cover 310-1 may include a first hinge cover surface 310-1a on which a curved rail guide is disposed, and the second hinge cover 310-2 may include a second hinge cover surface 310-2a which faces the first hinge cover surface 310-1a and on which a curved rail guide is disposed.

According to various embodiments, a plurality of bars (multi-bars) 540 may be provided. The multi-bars 540 may be disposed on opposite sides of the center bar 530, and may be located to face the folding area (e.g., the folding area A3 in FIG. 1). For example, two multi-bars 540 may be disposed on each side of the center bar 530.

According to various embodiments, the multi-bar assembly 206 may include a plurality of bar support holders 430 and 440 and bar support brackets 410 and 420. According to an embodiment, first bar support holders 430 of the multi-bar assembly 206 are capable of connecting first rotation brackets 331 to the first housing (e.g., the first housing 201 in FIGS. 3 and 4), and second bar support holders 440 may connect second rotation brackets 341 to the second housing (e.g., the second housing 202 in FIGS. 3 and 4). According to an embodiment, the first housing 201 is connected to the first rotation brackets 331 via the first bar support holders 430 so as to rotate according to the movement of the first rotation brackets 331, and the second housing 202 may be connected to the second rotation brackets 341 via the second bar support holders 440 so as to rotate according to the movement of the second rotation brackets 341. According to an embodiment, the first bar support holders 430 may be connected to some of the multi-bars 540, and the second bar support holders 440 may be connected to remaining ones of the multi-bars 540.

According to various embodiments, the bar support brackets 410 and 420 may include center bar support brackets 410 configured to support the center bar 530 and multi-bar support brackets 420 configured to support the multi-bars 540. According to an embodiment, the center bar 530 is coupled to the foldable housing (e.g., the foldable housing 300 of FIG. 1) via the center bar support brackets 410, and the multi-bars 540 may be coupled to the foldable housing 300 via the multi-bar support brackets 420. Hereinafter, the configurations of the bar support brackets 410 and 420 will be described in greater detail.

Figure 7:
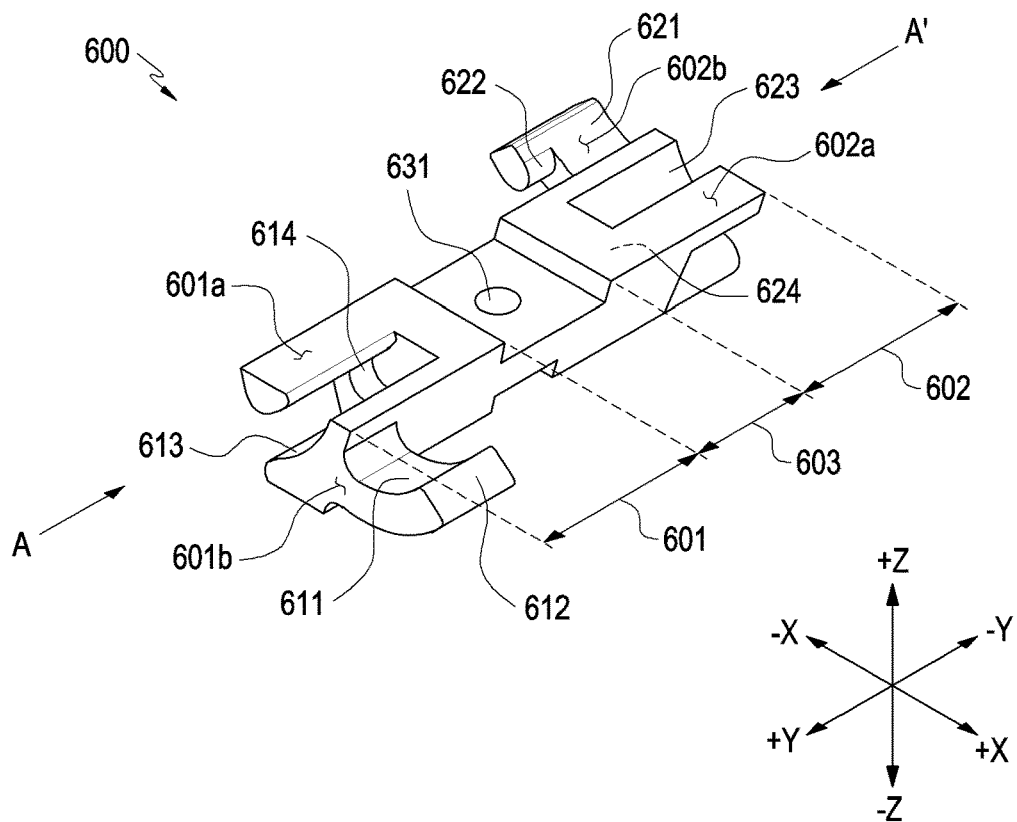
FIG. 7 is a perspective view illustrating one bar support bracket in a multi-bar assembly of an electronic device according to various embodiments.
Figure 8:
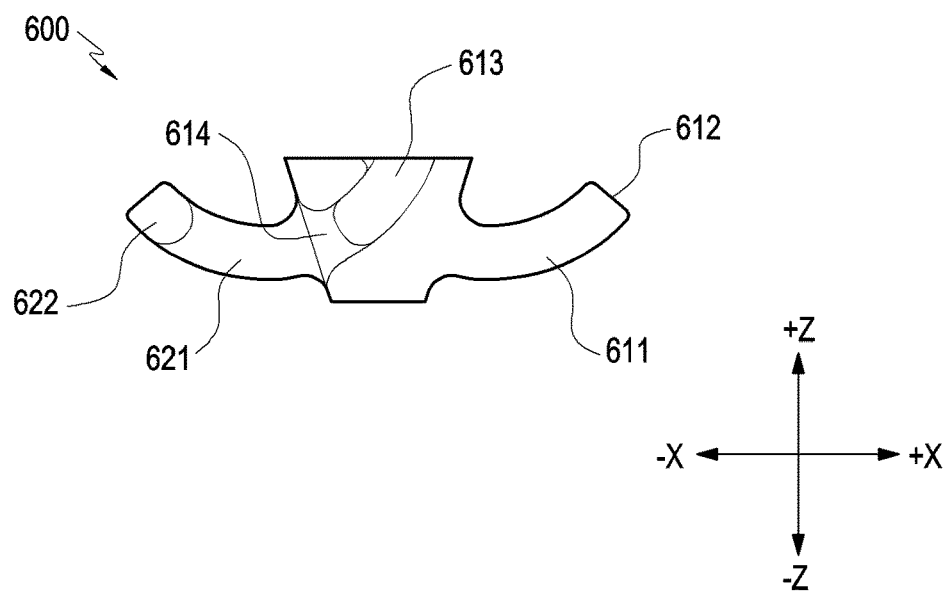
FIG. 8 is a side view of the bar support bracket of FIG. 7 when viewed in the direction A according to various embodiments.

FIG. 7 is a perspective view illustrating an example bar support bracket 600 (e.g., the bar support bracket 410 or 420 in FIGS. 5 and 6) in a multi-bar assembly (e.g., the multi-bar assembly 206 in FIGS. 5 and 6) of an electronic device (e.g., the electronic device 200 in FIGS. 3 and 4) according to various embodiments. FIG. 8 is a side view of the bar support bracket 600 of FIG. 7 when viewed in the direction A according to various embodiments. The direction A may refer to a direction oriented in the −Y axis direction in the Cartesian coordinate system.

According to various embodiments, the multi-bar assembly (e.g., the multi-bar assembly 206 in FIGS. 5 and 6) may include a plurality of bars (e.g., the center bar 530 and the multi-bars 540 in FIGS. 5 and 6), bar support brackets 600 (e.g., the bar support brackets 410 and 420 in FIGS. 5 and 6), and bar support holders (e.g., the bar support holders 430 and 440 in FIGS. 5 and 6) disposed on opposite sides of each bar support bracket 600. The plurality of bars may include a center bar (e.g., the center bar 530 in FIGS. 5 and 6) and multi-bars (e.g., the multi-bars 540 in FIGS. 5 and 6). The bar support brackets 600 may include center bar support brackets configured to support the center bar 530 (e.g., the center bar support brackets 410 in FIGS. 5 and 6), and multi-bar support brackets configured to support the multi-bars 540 (e.g., the multi-bar support brackets 420 of FIGS.

5 and 6). The shapes of the center bar support brackets 410 and the multi-bar support brackets 420 may be the same.

According to various embodiments, each bar support bracket 600 may include a central portion 603 in which a fastening hole 631 is disposed, a first portion 601 extending from the central portion 603 in the +Y-axis direction, and a second portion 602 extending from the central portion 603 in the −Y-axis direction opposite to the +Y-axis direction. The +Y-axis direction and/or the −Y-axis direction may be parallel to the longitudinal direction of the plurality of bars. According to an embodiment, the structure of the first portion 601 and the structure of the second portion 602 may be implemented in shapes corresponding to each other. For example, in corresponding to each other, the second portion 602 may have the same structure as the first portion 601, but the second portion 602 takes a form in which the left and right sides thereof are inverted with respect to the first portion 601.

According to various embodiments, the central portion 603 of the bar support bracket 600 has a plate shape and connects the first portion 601 and the second portion 602. The central portion 603 may include at least one fastening hole 631 disposed in the upper surface thereof, for example, the surface oriented in the +Z-axis direction. The at least one fastening hole 631 may include, for example, a thread formed in the inner wall thereof, and may provide a means to allow the bar support bracket 600 to be positioned in the multi-bar assembly 206 (e.g., each of the bars). In various embodiments, each of the bars of the multi-bar assembly 206 may include a fastening boss corresponding to the fastening hole 631.

According to various embodiments, the first portion 601 of the bar support bracket 600 may include an extension 601a extending in the +Y-axis direction from the central portion 603 and a protrusion 601b protruding from the extension 601a in a direction perpendicular to the +Y axis. The extension 601a may include a (1-1)th rail guide 613 and a (1-1)th rail guide stopper 614, and the protrusion 601b may include a (1-1)th rail 611 and a (1-1)th rail stopper 612. The (1-1)th rail 611, the (1-1)th rail stopper 612, the (1-1)th rail guide 613, and the (1-1)th rail guide stopper 614 may have an integrated structure made of the same material.

According to an embodiment, the (1-1)th rail 611 may protrude in a direction (e.g., +X-axis direction) perpendicular to the longitudinal direction (e.g., +Y/−Y-axis direction) of the bar support bracket 600. At least a portion of the (1-1)th rail 611 may include a curved structure. For example, the (1-1)th rail 611 may have a curved rail structure. When the bar support bracket 600 is viewed in the direction A, the (1-1)th rail 611 has an upper surface (e.g., the surface oriented in the +Z direction) and a lower surface (e.g., the surface oriented in the −Z direction) may be configured in curved surfaces parallel to each other, and may provide a curved structure convex downwards, for example, in the −Z direction. The (1-1)th rail 611 may be a portion to be slid along a rail guide of a bar support bracket adjacent thereto.

According to an embodiment, the (1-1)th rail stopper 612 protrudes in the longitudinal direction of the bar support bracket 600 from the end of the (1-1)th rail 611, and at least a portion of the (1-1)th rail stopper 612 may include a curved structure. For example, the (1-1)th rail stopper 612 may have a structure protruding in the −Y-axis direction, and may be a portion configured to prevent and/or reduce the (1-1)th rail 611 from sliding beyond a predetermined distance. The curved structure of the (1-1)th rail stopper 612 is manufactured in a shape corresponding to the (1-1)th rail guide stopper 614 disposed at the end of the (1-1)th rail guide 613. Thus, when the (1-1)th rail stopper 612 comes into contact with the rail guide stopper of the bar support bracket adjacent thereto, the (1-1)th rail stopper 612 and the rail guide stopper are stably fitted to each other, and the sliding movement of the (1-1)th rail 611 can be stopped.

According to an embodiment, the (1-1)th rail guide 613 may have a recess shape (or a through hole shape with one open side) extending from the upper surface (e.g., the surface oriented in the +Z direction) of the first portion 601 towards the side surface (e.g., the surface oriented in the −X direction) of the first portion 601 and penetrating the inside of the first portion 601. The recess shape (or the through hole shape) may be implemented to correspond to the curved shape of the (1-1)th rail 611 so as to guide the rail of the bar support bracket adjacent thereto to stably slide along a bent line in the (1-1)th rail guide 613.

According to an embodiment, the (1-1)th rail guide stopper 614 protrudes in the longitudinal direction of the bar support bracket 600 from the inner end of the (1-1)th rail guide 613, and at least a portion of the (1-1)th rail guide stopper 614 may include a curved structure. For example, the (1-1)th rail guide stopper 614 has a structure protruding in the +Y-axis direction, and may suppress the movement of the rail that slides in the (1-1)th rail guide 613. The curved structure of the (1-1)th rail guide stopper 614 is manufactured to have a shape corresponding to the (1-1)th rail stopper 612. When the (1-1)th rail guide stopper 614 comes into contact with the rail stopper adjacent thereto, the (1-1)th rail guide stopper 614 and the rail stopper are stably fitted to each other, and the sliding movement of the rail moving in the (1-1)th rail guide can be stopped.

According to various embodiments, the second portion 602 of the bar support bracket 600 may include an extension 602a extending in the −Y-axis direction from the central portion 603 and a protrusion 602b protruding from the extension 602a in a direction perpendicular to the −Y axis. The extension 602a may include a (1-2)th rail guide 623 and a (1-2)th rail guide stopper 624, and the protrusion 602b may include a (1-2)th rail 621 and a (1-2)th rail stopper 622. The (1-2)th rail 621, the (1-2)th rail stopper 622, the (1-2)th rail guide 623, and the (1-2)th rail guide stopper 624 may have an integrated structure made of the same material. The bar support bracket 600 is integrally configured as a whole, and the central portion 603, the first portion 601, and the second portion 602 may be made of the same material.

According to an embodiment, the (1-2)th rail 621 may protrude in a direction perpendicular to the longitudinal direction of the bar support bracket 600. At least a portion of the (1-2)th rail 621 may include a curved structure. The (1-2)th rail 621 may have a structure that protrudes in the opposite direction to the (1-1)th rail 611. For example, the (1-2)th rail 621 may have a curved rail structure. When the bar support bracket 600 is viewed in the A' direction, the (1-2)th rail 621 has an upper surface (e.g., the surface oriented in the +Z direction) and a lower surface (e.g., the surface oriented in the +Z direction) may be configured in curved surfaces parallel to each other, and may provide a curved structure convex downwards, for example, in the −Z direction. The (1-2)th rail 621 may be a portion to be slid along a rail guide of a bar support bracket adjacent thereto.

According to an embodiment, the (1-2)th rail stopper 622 protrudes in the longitudinal direction of the bar support bracket 600 from the end of the (1-2)th rail 621, and at least a portion of the (1-2)th rail stopper 612 may include a curved structure. For example, the (1-2)th rail stopper 622 may have a structure protruding in the +Y-axis direction, and may be a portion configured to prevent and/or reduce the (1-2)th rail 621 from sliding beyond a predetermined distance. The curved structure of the (1-2)th rail stopper 622 is manufactured in a shape corresponding to the (1-2)th rail guide stopper 624 disposed at the end of the (1-2)th rail guide 623. Thus, when the (1-2)th rail stopper 622 comes into contact with the rail guide stopper of the support bracket adjacent thereto, the (1-2)th rail stopper 612 and the rail guide stopper are stably fitted to each other, and the sliding movement of the (1-2)th rail 621 can be stopped.

According to an embodiment, the (1-2)th rail guide 623 may have a recess shape (or a through hole shape with one open side) extending from the upper surface (e.g., the surface oriented in the +Z direction) of the second portion 602 towards the side surface (e.g., the surface oriented in the +X direction) of the first portion 602 and penetrating the inside of the second portion 602. The recess shape (or the through hole shape) may be implemented to correspond to the curved shape of the (1-2)th rail 621 so as to guide the rail of the bar support bracket adjacent thereto to stably slide along a bent line in the (1-2)th rail guide 623.

According to an embodiment, the (1-2)th rail guide stopper 624 protrudes in the longitudinal direction of the bar support bracket 600 from the inner end of the (1-2)th rail guide 623, and at least a portion of the (1-1)th rail guide stopper 614 may include a curved structure. For example, the (1-2)th rail guide stopper 624 has a structure protruding in the −Y-axis direction, and may suppress the movement of the rail that slides in the (1-2)th rail guide 623. The curved structure of the (1-2)th rail guide stopper 624 is manufactured to have a shape corresponding to the (1-2)th rail stopper 622. When the (1-2)th rail guide stopper 624 comes into contact with the rail stopper of the bar support bracket adjacent thereto, the (1-2)th rail guide stopper 624 and the rail stopper are stably fitted to each other, and the sliding movement of the rail moving in the (1-2)th rail guide can be stopped.

Figure 9:
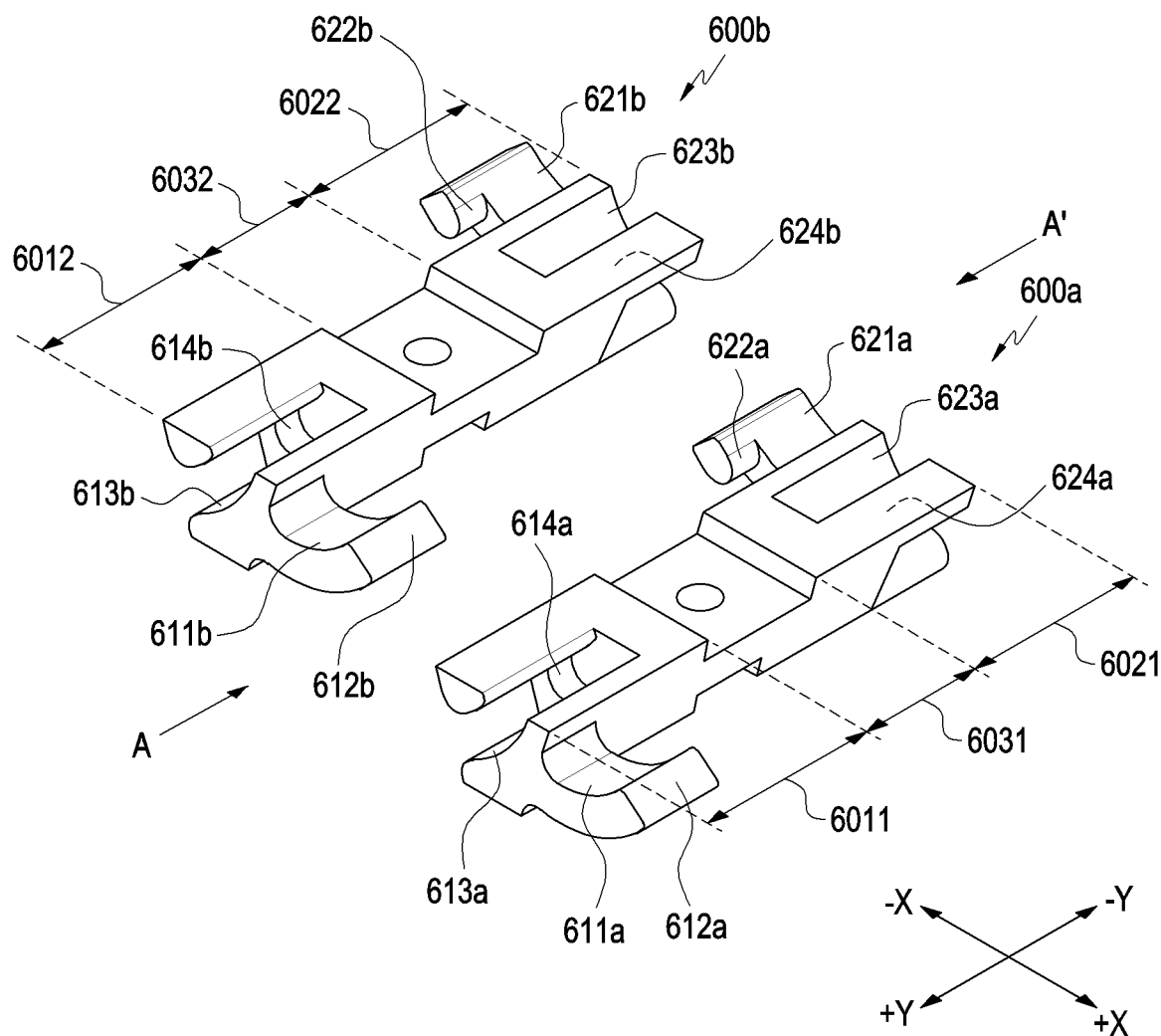
FIG. 9 is a perspective view illustrating a plurality of bar support brackets disposed adjacent to each other in a multi-bar assembly of an electronic device according to various embodiments.
Figure 10:
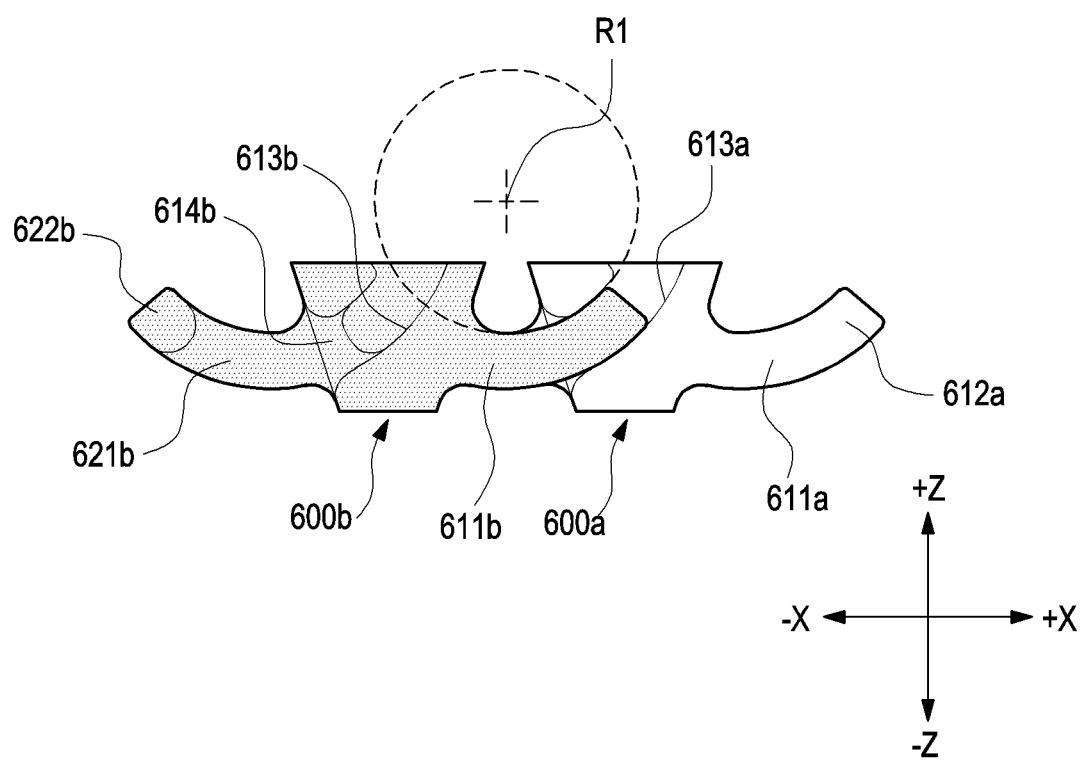
FIG. 10 is a side view illustrating the configuration, in which a plurality of adjacent bar support brackets of FIG. 9 are coupled to each other, when viewed in the direction A according to various embodiments.
Figure 11A:
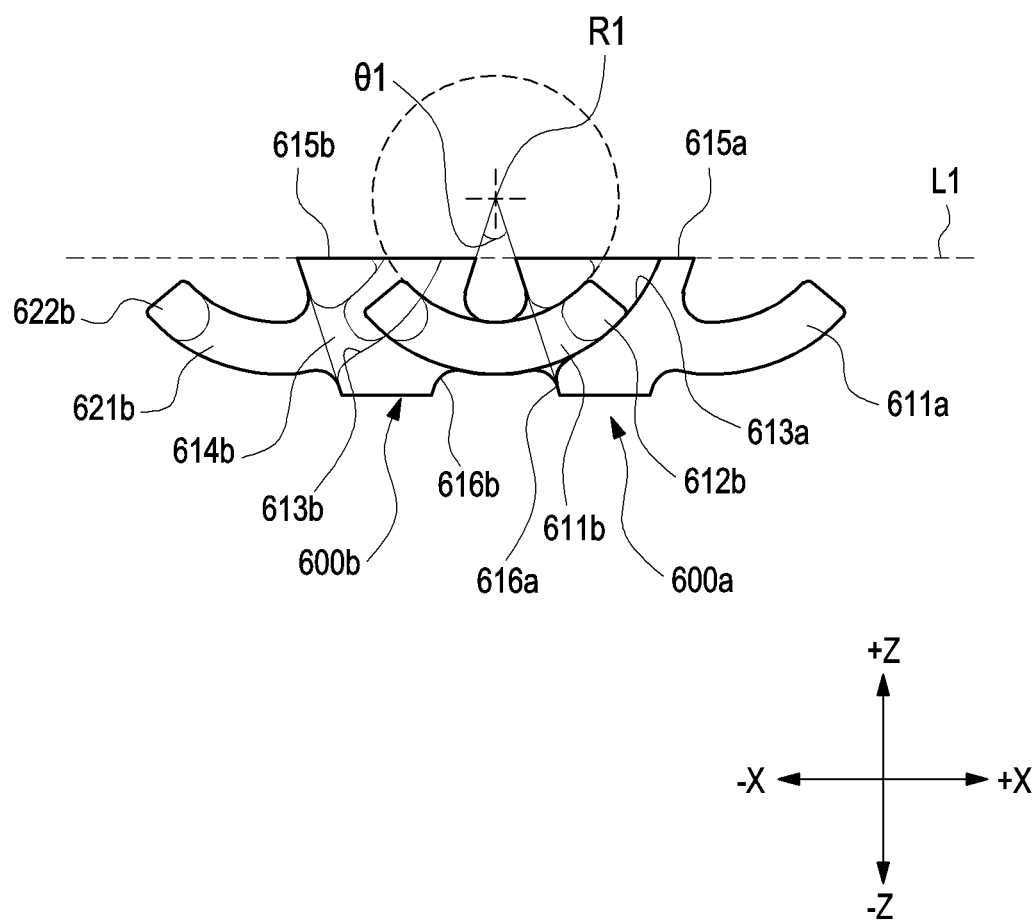
FIGS. 11A, 11B and 11C are side views illustrating rotational movement of a plurality of adjacent bar support brackets according to various embodiments.
Figure 11B:
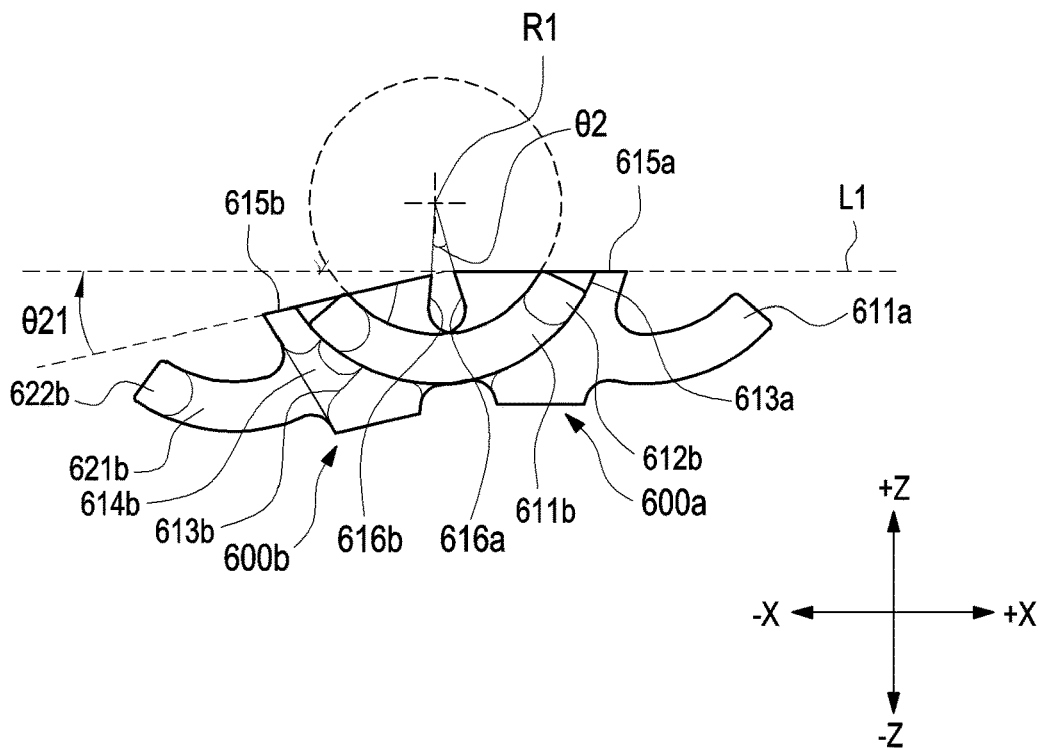
Figure 11C:
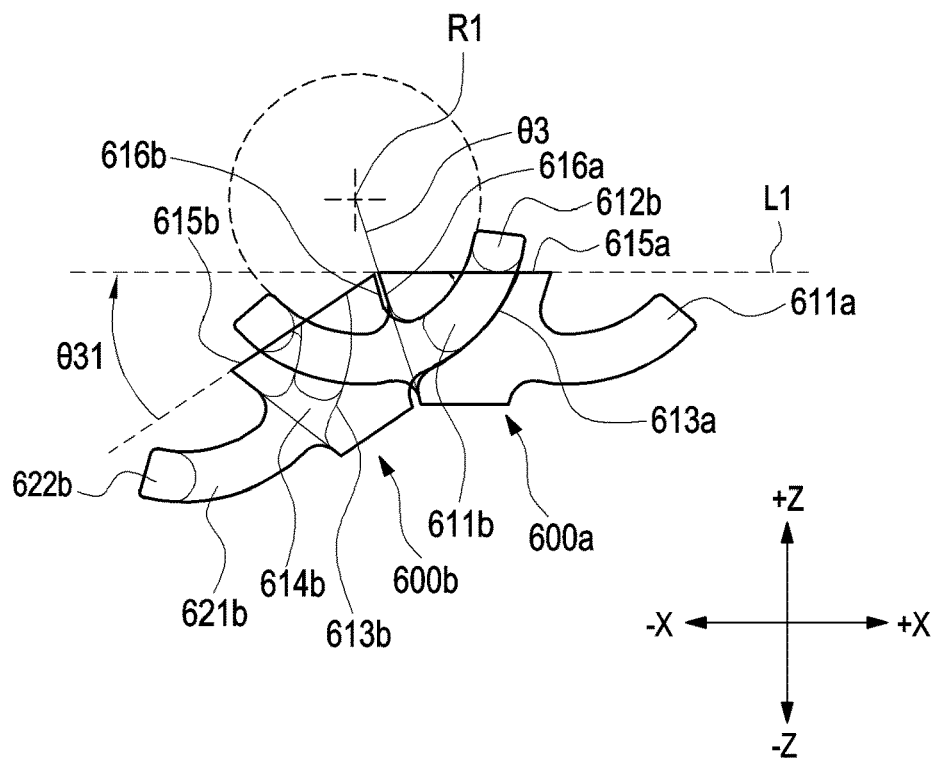

FIG. 9 is a perspective view illustrating a plurality of support brackets 600a and 600b disposed adjacent to each other in a multi-bar assembly (e.g., the multi-bar assembly 206 in FIGS. 3 and 4) in an electronic device (e.g., the electronic device 200 in FIGS. 3 and 4) according to various embodiments. FIG. 10 is a side view illustrating the configuration, in which the plurality of adjacent bar support brackets 600a and 600b are coupled to each other, when viewed in the direction A in FIG. 9 according to various embodiments. FIGS. 11A, 11B and 11C are side views illustrating the rotational movement of a plurality of adjacent bar support brackets 600a and 600b according to various embodiments.

According to various embodiments, the multi-bar assembly (e.g., the multi-bar assembly 206 in FIGS. 5 and 6) may include a plurality of bars (e.g., the center bar 530 and the multi-bars 540 in FIGS. 5 and 6), bar support brackets 600 (e.g., the bar support brackets 410 and 420 in FIGS. 5 and 6), and bar support holders (e.g., the bar support holders 430 and 440 in FIGS. 5 and 6) disposed on opposite sides of each bar support bracket 600.

According to various embodiments, the bar support brackets 600a and 600b may include a center bar support bracket 600a configured to support a center bar 530 (e.g., the center bar support brackets 410 in FIGS. 5 and 6), and a multi-bar support bracket 600b configured to support a multi-bar 540 (e.g., the multi-bar support brackets 420 of FIGS. 5 and 6). The shapes of the center bar support bracket 600a and the multi-bar support bracket 600b may be the same.

Referring to FIGS. 9, 10, 11A, 11B and 11C, with reference to the center bar support bracket 600a disposed on the right side, the multi-bar support bracket 600b may be disposed on the left side, and the center bar support bracket 600a and the multi-bar support bracket 600b may be coupled to each other so as to enable sliding and/or rotational movement with respect to each other. The structures of the center bar support bracket 600a and the multi-bar support bracket 600b may be entirely or partially the same as the structure of the bar support bracket 600 illustrated in FIGS. 7 and 8.

According to various embodiments, the center bar support bracket 600a may include a central portion 6031, a (1-1)th portion 6011 extending from the central portion 6031 in the +Y-axis direction, and a (1-2)th portion 6021 extending from the central portion 6031 in the −Y-axis direction opposite to the +Y-axis direction. According to an embodiment, the (1-1)th portion 6011 of the center bar support bracket 600a may include a (1-1)th rail 611a, a (1-1)th rail stopper 612a, a (1-1)th rail guide 613a, and a (1-1)th rail guide stopper 614a. The (1-2)th portion 6021 of the center bar support bracket 600a may include a (1-2)th rail 621a, a (1-2)th rail stopper 622a, a (1-2)th rail guide 623a, and a (1-2)th rail guide stopper 624a.

According to various embodiments, the multi-bar support bracket 600b may include a central portion 6032, a (2-1)th portion 6012 extending from the central portion 6032 in the +Y-axis direction, and a (2-2)th portion 6022 extending from the central portion 603b in the −Y-axis direction opposite to the +Y-axis direction. According to an embodiment, the (2-1)th portion 6012 of the center bar support bracket 600a may include a (2-1)th rail 611b, a (2-1)th rail stopper 612b, a (2-1)th rail guide 613b, and a (2-1)th rail guide stopper 614b. The (2-2)th portion 6022 of the center bar support bracket 600a may include a (2-2)th rail 621b, a (2-2)th rail stopper 622b, and a (2-2)th rail guide 623b, and a (2-2)th rail guide stopper 624b.

According to various embodiments, the center bar support bracket 600a and the multi-bar support bracket 600b may be rotatably coupled to each other. According to an embodiment, at least a portion of the (2-1)th portion 6012 of the multi-bar support bracket 600b may be coupled to at least a portion of the (1-1)th portion 6011 of the center bar support bracket 600a. For example, the (2-1)th rail 611b (and/or the (2-1)th rail stopper 612b) of the multi-bar support bracket 600b may be assembled to be slidable in the (1-1)th rail guide (613a) of the center bar support bracket 600a. According to an embodiment, at least a portion of the (1-2)th portion 6021 of the center bar support bracket 600a may be coupled to at least a portion of the (2-2)th portion 6022 of the multi-bar support bracket 600b. For example, the (1-2)th rail 621a (and/or the (1-2)th rail stopper 622a) of the center bar support bracket 600a may be assembled to be slidable in the (2-2)th rail guide 623b of the multi-bar support bracket 600b.

According to various embodiments, each of the rails (e.g., the (1-1)th rail 611a and/or the (1-2)th rail 621a) of the center bar support bracket 600a may rotate with reference to one rotation axis, and each of the rails (e.g., the (2-1)th rail 611b and/or the (2-2)th rail 621b) of the multi-bar support bracket 600b may rotate with reference to another rotation axis.

According to various embodiments, the center bar support bracket 600a and the multi-bar support bracket 600b may be assembled to each other such that the rotation axis of the (1-2)th rail 621a of the center bar support bracket 600a coincides with the rotation axis of the s(2-1)th rail 611b of the multi-bar support bracket 600b when the structure in which the center bar support bracket 600a and the multi-bar support bracket 600b are assembled to each other is viewed in the direction A. Accordingly, with reference to the coincident rotation axis R1, each of the rails (e.g., the (1-1)th rail 611a and/or the (1-2)th rail 621a) of the center bar support bracket 600a and each of the rails (e.g., the (2-1)th rail 611b and/or the (2-2)th rail 621b) of the multi-bar support bracket 600b may rotate and slide.

According to various embodiments, when the first housing 201 and/or the second housing 202 gradually rotate from the unfolded position to the folded position, the multi-bar assembly 206, which supports the bending area of the flexible display (e.g., the flexible display 203 in FIG. 3) may define a curved surface corresponding to the bending area. With reference to FIGS. 11A to 11CA, a description will be made of the rotational movement of the bar support brackets 600 that changes the flexible display 203 in a partial area of the bending area of the flexible display 203 when the electronic device is switched from the unfolded position to the folded position.

According to various embodiments, the state in which the center bar support bracket 600a and the multi-bar support bracket 600b are arranged side by side is defined as a first state S1 (e.g., FIG. 11A), the state in which the multi-bar support bracket 600b is rotating with respect to the center bar support bracket 600a is defined as a second state S2 (e.g., FIG. 11B), and the state in which the rotation of the multi-bar support bracket 600b with respect to the center bar support bracket 600a is completed and side surfaces face each other may be defined as a third state S3 (e.g., FIG. 11C). As another example, the upper surface of the center bar support bracket 600a, for example, the surface oriented in the +Z direction may be set as a reference plane L1 (or a reference line).

Referring to FIG. 11A, in the first state (S1), a first upper surface 615a of the center bar support bracket 600a and a second upper surface 615b of the multi-bar support bracket 600b may be disposed to be oriented in the same direction (e.g., the +Z-axis direction). For example, the first upper surface 615a of the center bar support bracket 600a and the second upper surface 615b of the multi-bar support bracket 600b may coincide with the reference plane L1.

According to an embodiment, in the first state (S1), one rail of the center bar support bracket 600a is located in one rail guide of the multi-bar support bracket 600b, and the other rail of the multi-bar support bracket 600b may be located in the other rail guide of the center bar support bracket 600a. For example, the (1-2)th rail 621a of the center bar support bracket 600a is located in the (2-2)th rail guide 623b of the multi-bar support bracket 600b, the (1-2)th rail stopper 622a of the center bar support bracket 600a comes into contact with the (2-2)th rail guide stopper 624b of the multi-bar support bracket 600b so that the further rotation of the (1-2)th rail 621a is limited, and the first upper surface 615a of the center bar support bracket 600a and the second upper surface 615b of the multi-bar support bracket 600b are capable of maintaining 180 degrees.

According to an embodiment, in the first state (S1), a first side surface 616a of the center bar support bracket 600a facing the multi-bar support bracket 600b and a second side surface 616b of the multi-bar support bracket 600b facing the center bar support bracket 600 are capable of being spaced apart from each other. For example, the first side surface 616a and the second side surface 616b may set a predetermined first angle θ1 with reference to a rotation axis R1. According to an embodiment, depending on the first state (S1), the second state (S2), and the third state (S3), the position of the multi-bar support bracket 600b with respect to the center bar support bracket 600a varies. Accordingly, the angle formed by the first side surface 616a and the second side surface 616b with reference to the rotation axis R1 may be reduced, and the maximum angle may be formed in the first state S1.

Referring to FIG. 11B, in the second state (S2), the first upper surface 615a of the center bar support bracket 600a and the second upper surface 615b of the multi-bar support bracket 600b may be disposed to be oriented in different directions. For example, the first upper surface 615a of the center bar support bracket 600a may define the reference plane L1, and the second upper surface 615b of the multi-bar support bracket 600b may be in the state of being rotated by a predetermined angle θ21 with respect to the reference plane L1.

According to an embodiment, in the second state (S2), one rail of the center bar support bracket 600a is located in one rail guide of the multi-bar support bracket 600b, and one rail of the multi-bar support bracket 600b may be located in one rail guide of the center bar support bracket 600a. The second state S2 may be the state in which the rail of the center bar support bracket 600a (or the multi-bar support bracket 600b) performs a sliding operation to move along the rail guide of the multi-bar support bracket 600b (or the center bar support bracket 600a). According to an embodiment, in the sliding operation, the (1-2)th rails 621a of the center bar support bracket 600a is slidable along the (2-2)th rail guide 623b of the multi-bar support bracket 600b. For example, the (1-2)th rail 621a is movable from the second side surface 616b of the multi-bar support bracket 600b towards the second upper surface 615b while being in contact with the curved surface of the (2-2)th rail guide 623b. The curved surface may be a part of an imaginary radius of curvature defined with respect to the rotation axis R1.

According to an embodiment, in the second state (S2), when a first side surface 616a of the center bar support bracket 600a facing the multi-bar support bracket 600b and a second side surface 616b of the multi-bar support bracket 600b facing the center bar support bracket 600 are capable of being spaced apart from each other, the spacing distance may be smaller than that in the first state S1. For example, the first side surface 616a and the second side surface 616b may set a predetermined second angle θ2 with reference to the rotation axis R1. The second angle θ2 may be smaller than the first angle θ1 in the first state (S1).

Referring to FIG. 11C, in the third state (S3), the first upper surface 615a of the center bar support bracket 600a and the second upper surface 615b of the multi-bar support bracket 600b may be disposed to be oriented in different directions. For example, the first upper surface 615a of the center bar support bracket 600a may define the reference plane L1, and the second upper surface 615b of the multi-bar support bracket 600b may be in the state of being rotated by a predetermined angle θ31 with respect to the reference plane L1. The rotated state of the third state S3 may be greater than the rotated state of the second state S2.

According to an embodiment, in the third state (S3), one rail of the center bar support bracket 600a is located in one rail guide of the multi-bar support bracket 600b, and one rail of the multi-bar support bracket 600b may be located in one rail guide of the center bar support bracket 600a, or may at least partially protrude to the outside of the rail guide. For example, at least a portion of the (1-2)th rail 621a of the center bar support bracket 600a may be located to be exposed to the outside of the (2-2)th rail guide 623b of the multi-bar support bracket 600b and to protrude from the second upper surface 615b.

According to an embodiment, in the third state (S3), a first side surface 616a of the center bar support bracket 600a facing the multi-bar support bracket 600b and a second side surface 616b of the multi-bar support bracket 600b facing the center bar support bracket 600 may be located to be in contact with each other or to face each other. For example, the first side surface 616a and the second side surface 616b may set a predetermined third angle θ3 with reference to the rotation axis R1. According to an embodiment, depending on the first state (S1), the second state (S2), and the third state (S3), the position of the multi-bar support bracket 600b with respect to the center bar support bracket 600a varies. Accordingly, the angle formed by the first side surface 616a and the second side surface 616b with reference to the rotation axis R1 may be reduced, and the minimum angle (e.g., the angle of 0 degrees) may be formed in the third state S3.

Figure 12A:
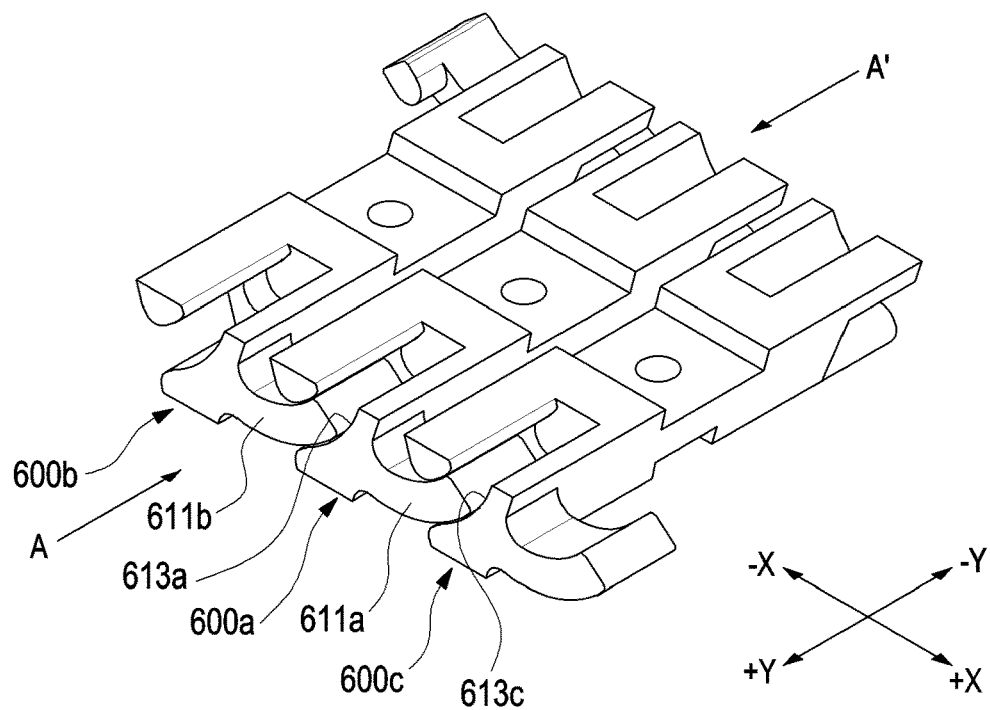
FIGS. 12A, 12B and 12C are perspective views illustrating rotational movement of a plurality of support brackets disposed adjacent to each other in a multi-bar assembly of an electronic device according to various embodiments.
Figure 12B:
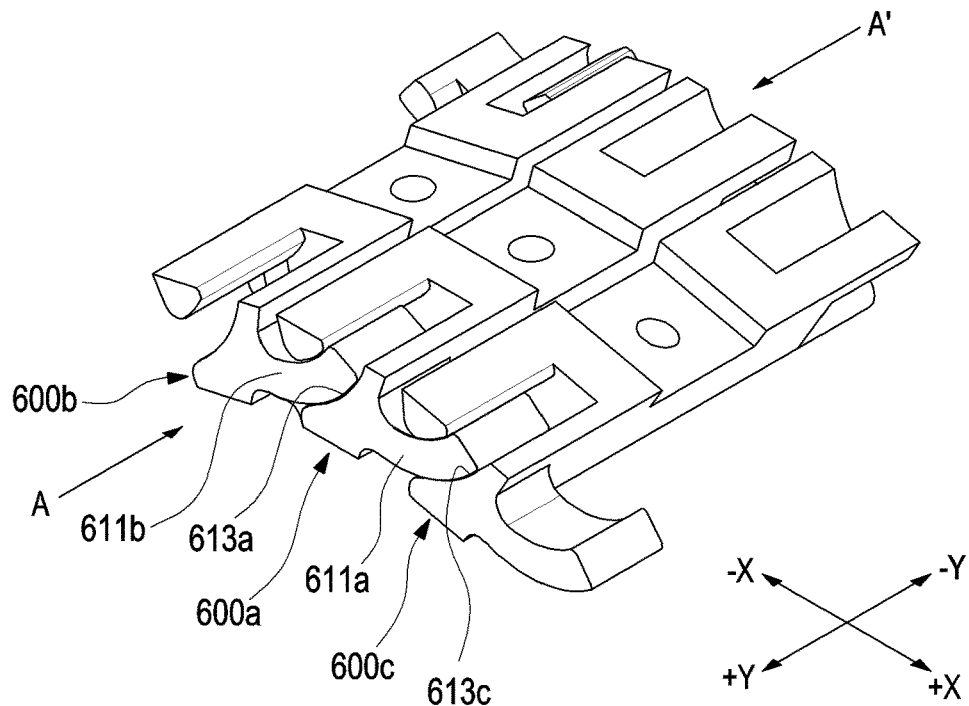
Figure 12C:
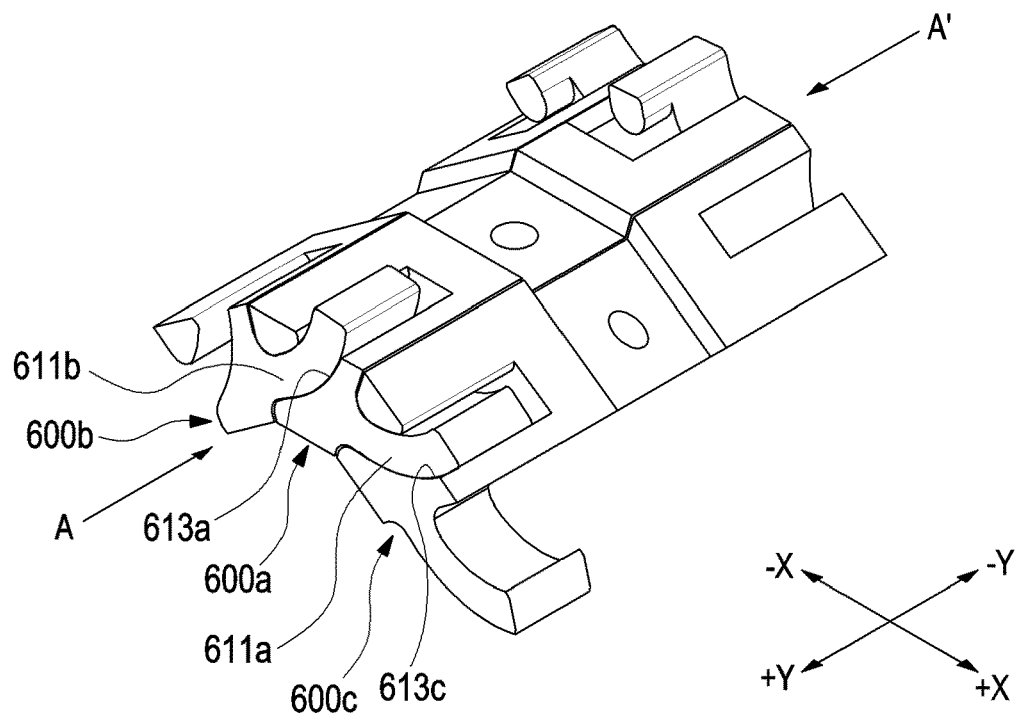
Figure 13A:
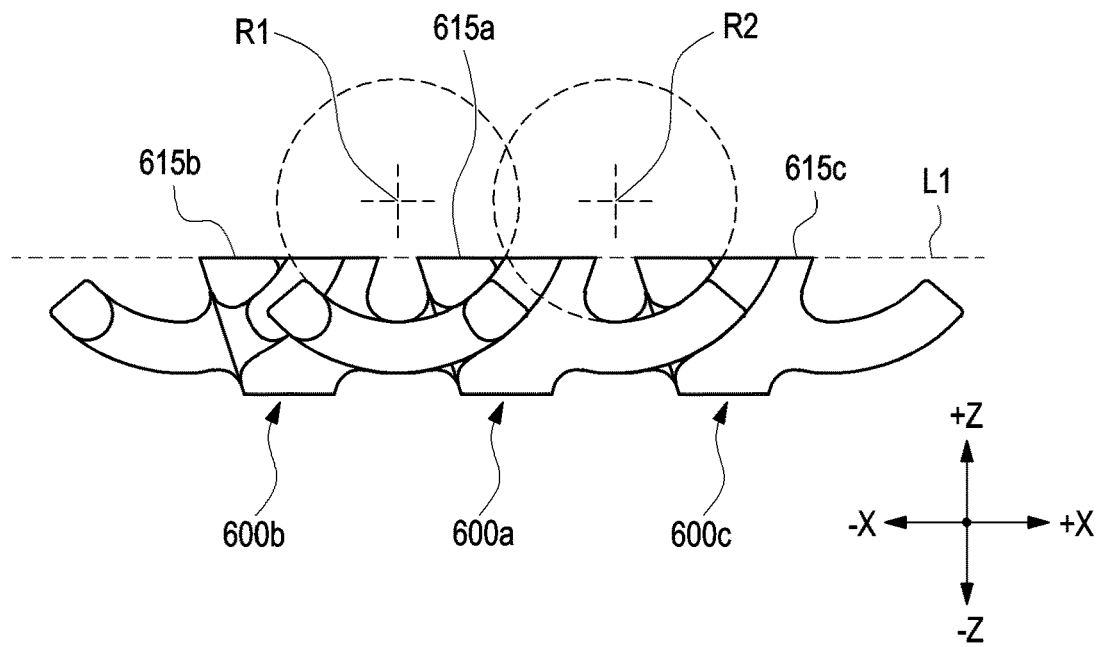
FIGS. 13A, 13B and 13C are side views illustrating rotational movement of a plurality of support brackets disposed adjacent to each other in a multi-bar assembly of an electronic device according to various embodiments.
Figure 13B:
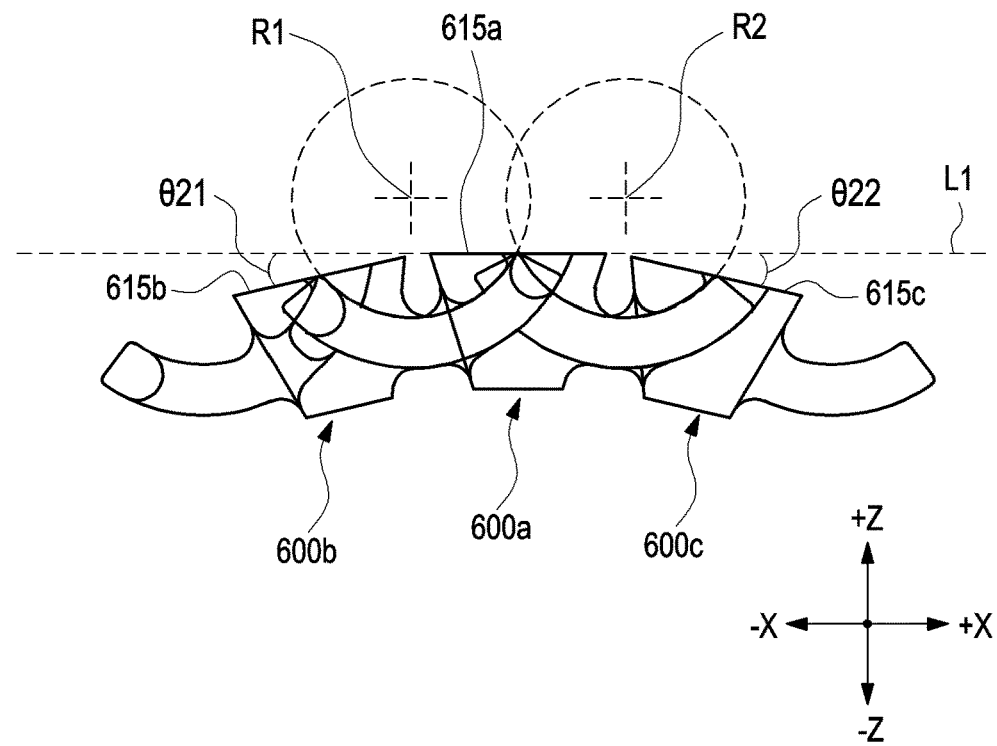
Figure 13C:
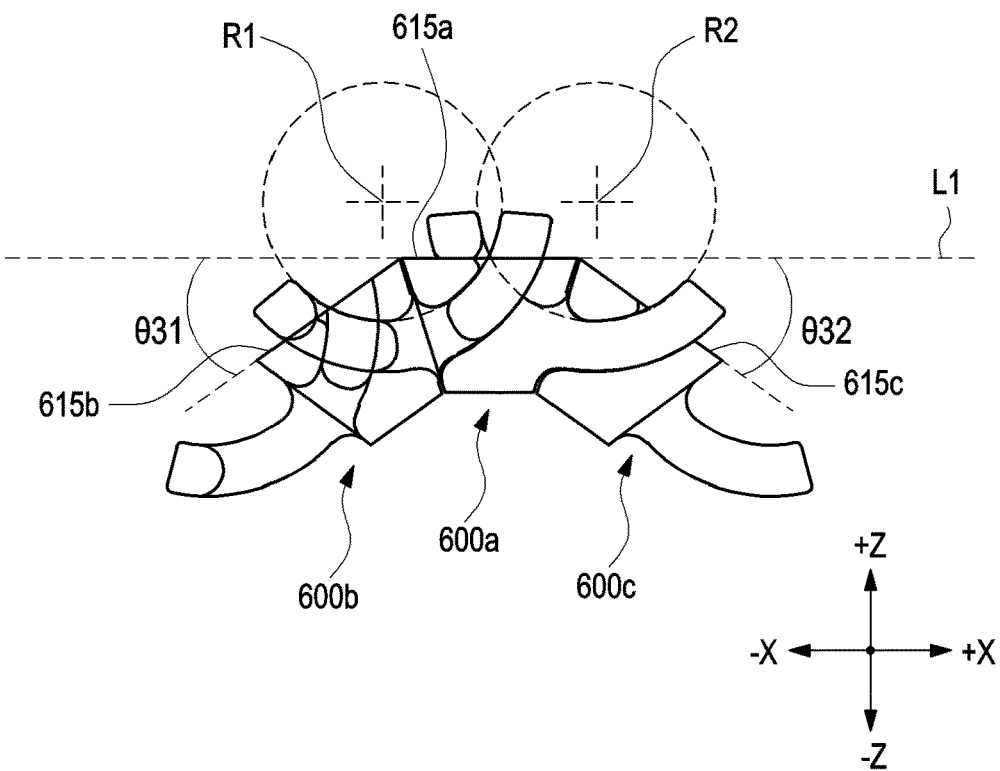

FIGS. 12A, 12B and 12C are perspective views illustrating the rotational movement of a plurality of support brackets 600a, 600b, and 600c disposed adjacent to each other in a multi-bar assembly (e.g., the multi-bar assembly 206 in FIGS. 3 and 4) in an electronic device (e.g., the electronic device 200 in FIGS. 3 and 4) according to various embodiments. FIGS. 13A, 13B and 13C are side views illustrating the rotational movement of a plurality of support brackets 600a, 600b, and 600c disposed adjacent to each other in a multi-bar assembly (e.g., the multi-bar assembly 206 in FIGS. 3 and 4) in an electronic device (e.g., the electronic device 200 in FIGS. 3 and 4) according to various embodiments.

According to various embodiments, the multi-bar assembly (e.g., the multi-bar assembly 206 in FIGS. 5 and 6) may include a plurality of bars (e.g., the center bar 530 and the multi-bars 540 in FIGS. 5 and 6), bar support brackets 600 (e.g., the bar support brackets 410 and 420 in FIGS. 5 and 6), and bar support holders (e.g., the bar support holders 430 and 440 in FIGS. 5 and 6) disposed on opposite sides of each bar support bracket 600.

According to various embodiments, the bar support brackets 600a, 600b, and 600c may include a center bar support bracket 600a configured to support a center bar 530 (e.g., the center bar support brackets 410 in FIGS. 5 and 6), and multi-bar support brackets 600b and 600c configured to support multi-bars 540 (e.g., the multi-bar support brackets 420 of FIGS. 5 and 6), respectively. The shapes of the center bar support bracket 600a and the multi-bar support brackets 600b and 600c may be the same.

Referring to FIGS. 12A, 12B, 12C, 13A, 13B and 13C, with reference to the center bar support bracket 600a, the multi-bar support bracket 600b may be disposed on the left side, and the center bar support bracket 600a and the multi-bar support bracket 600b may be coupled to each other so as to enable sliding and/or rotational movement with respect to each other. With reference to the center bar support bracket 600a, the second multi-bar support bracket 600c may be disposed on the right side, and the center bar support bracket 600a and the multi-bar support bracket 600c may be coupled to each other so as to enable sliding and/or rotational movement with respect to each other. The structures of the center bar support bracket 600a and the multi-bar support bracket 600b may be entirely or partially the same as the structure of the bar support bracket 600 illustrated in FIGS. 7 and 8. The structure of the center bar support bracket 600a and the coupling and sliding structures of the multi-bar support bracket 600b of FIGS. 9, 10, 11A, 11B and 11C are applicable to the structure of the center bar support bracket 600a and the coupling and sliding structures of the first and second multi-bar support brackets 600b and 600c.

According to various embodiments, respective rails of the center bar support bracket 600a may be located in the rail guide of the first multi-bar support bracket 600b and the rail guide of the second multi-bar support bracket 600c, and one rail of each of the first and second multi-bar support brackets 600b and 600c may be located in a rail guide of the center bar support bracket 600a. For example, when viewed in the direction A, the rail 611b of the first multi-bar support bracket 600b may be coupled to be slidable along the rail guide 613a of the center bar support bracket 600a, and the rail 611a of the center bar support bracket 600a may be coupled to be slidable along the rail guide 613c of the second multi-bar support bracket 600c. As another example, when viewed in the direction A', the rail of the second multi-bar support bracket 600c may be coupled to be slidable along the rail guide of the center bar support bracket 600a, and the rail of the center bar support bracket 600a may be coupled to be slidable along the rail guide of the first multi-bar support bracket 600b.

According to various embodiments, one rail of the center bar support bracket 600a and one rail of the first multi-bar support bracket 600b may rotate and slide with reference to the first rotation axis R1, and the other rail of the center bar support bracket 600a and one rail of the second multi-bar support bracket 600c may rotate and slide with reference to the second rotation axis R2.

According to various embodiments, in the first state (FIGS. 12A and 13A), the upper surface 615a of the center bar support bracket 600a and the upper surfaces 615b and 615c of the first and second multi-bar support brackets 600b and 600c may be arranged side by side so as to be oriented in the same direction (e.g., the +Z-axis direction).

According to various embodiments, in the second state (FIGS. 12B and 13B), the upper surface 615a of the center bar support bracket 600a and the upper surfaces 615b and 615c of the first and second multi-bar support brackets 600b and 600c may be arranged so as to be oriented in different directions. For example, the upper surface of the center bar support bracket 600a may define a reference plane L1, the upper surface of the first multi-bar support bracket 600b may be rotated by a predetermine angle θ21 with respect to the reference plane L1, and the upper surface of the second multi-bar support bracket 600c may be rotated by a predetermined angle θ22 with respect to the reference plane L1.

According to various embodiments, in the third state (FIGS. 12C and 13C), the upper surface 615a of the center bar support bracket 600a and the upper surfaces of the first and second multi-bar support brackets 600b and 600c may be arranged so as to be oriented in different directions. For example, the upper surface of the center bar support bracket 600a may define a reference plane L1, the upper surface of the first multi-bar support bracket 600b may be rotated by a predetermine angle θ31 with respect to the reference plane L1, and the upper surface of the second multi-bar support bracket 600c may be rotated by a predetermined angle θ32 with respect to the reference plane L1. The angle by which the upper surfaces 615b and 615c of the first and second multi-bar support brackets 600b and 600c are rotated with respect to the reference plane L1 may be greater than the angle in the second state (S2).

Figure 14:
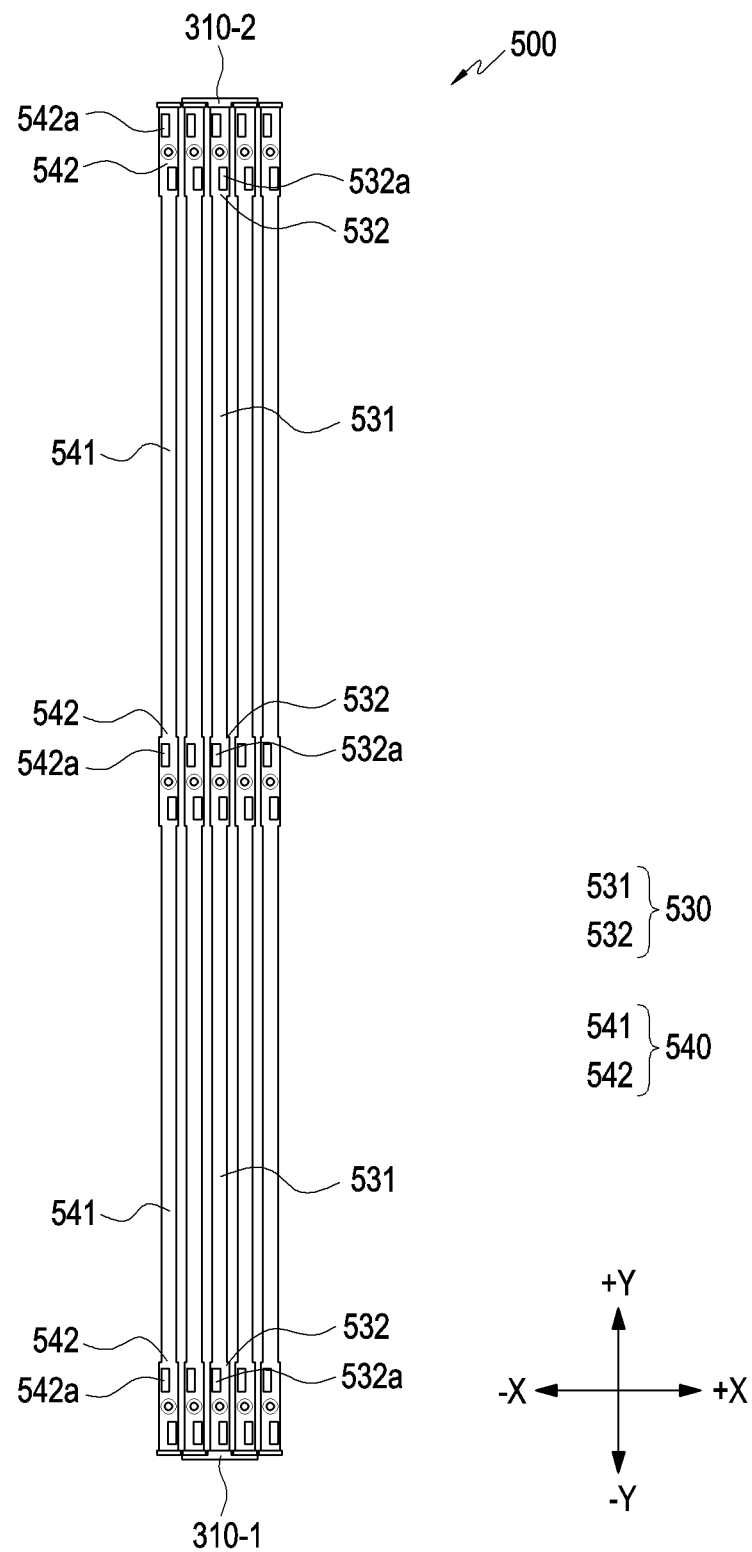
FIG. 14 is a diagram illustrating multi-bars in a state of being coupled in a multi-bar assembly of an electronic device according to various embodiments.
Figure 15A:
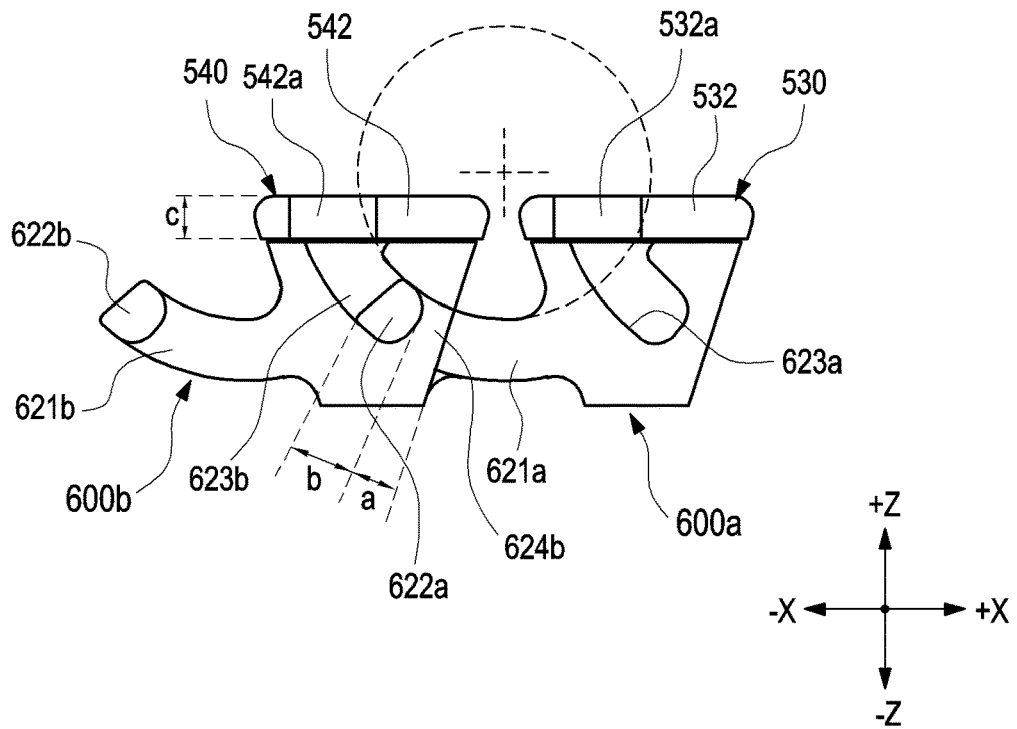
FIGS. 15A and 15B are side views illustrating an example configuration in which a plurality of adjacent bar support brackets and multi-bars are coupled to each other according to various embodiments.
Figure 15B:
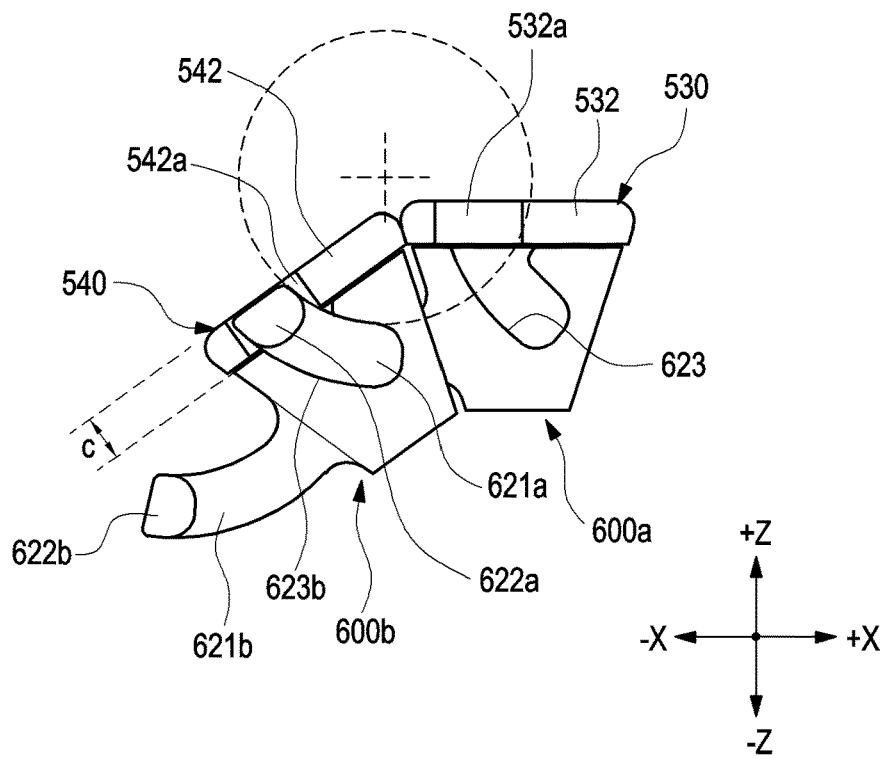

FIG. 14 is a diagram illustrating a state in which multi-bars are coupled to each other in a multi-bar assembly (e.g., the multi-bar assembly 206 in FIGS. 3 and 4) in an electronic device (e.g., the electronic device 200 in FIGS. 3 and 4) according to various embodiments. FIGS. 15A and 15B are side views illustrating a configuration in which a plurality of adjacent bar support brackets 600 and 600a and multi-bars 530 and 540 are coupled to each other according to various embodiments.

According to various embodiments, the multi-bar assembly (e.g., the multi-bar assembly 206 in FIGS. 5 and 6) may include a plurality of bars 530 and 540 (e.g., the center bar 530 and the multi-bars 540 in FIGS. 5 and 6), and bar support brackets 600a and 600b (e.g., the bar support brackets 410 and 420 in FIGS. 5 and 6).

According to various embodiments, the bar support brackets 600a and 600b may include a center bar support bracket 600a configured to support a center bar 530, and a multi-bar support bracket 600b configured to support a multi-bar 540 (e.g., the multi-bar support brackets 420 in FIGS. 5 and 6). The shapes of the center bar support bracket 600a and the multi-bar support bracket 600b may be the same. The shapes of the center bar 530 and the multi-bars 540 may be at least partially the same. The shapes of the center bar support bracket 600a and the multi-bar support bracket 600b may be at least partially the same.

Referring to FIG. 14, the center bar 530 may be positioned along the center line of the bending area to be capable of supporting the bending area of the flexible display (e.g., the flexible display 203 in FIG. 3). Opposite end portions of the center bar 530 in the +Y-axis/−Y-axis direction may be connected to the first hinge cover 310-1 and the second hinge cover 310-2.

According to an embodiment, the center bar 530 may include a first line portion 531 and a first dummy portion(s) 532 located in end portions (e.g., the opposite end portions in the +Y axis/—Y axis direction) and/or the center of the first line portion 531. The first line portion 531 may have the same thickness and may be disposed parallel with the adjacent multi-bars 540. The first dummy portion 532 may include at least one first guide recess 532a and may have a greater width (e.g., the length in the +X-axis/−X-axis direction) than the first line portion 531. The first guide recess 532a may have one of the shapes of an opening penetrating at least a portion of the first dummy portion 532 and a groove defined in at least a partial surface of the first dummy portion 532. For example, the first guide recess 532a of the first dummy portion 532 may provide an additional space in which at least a portion of the rail of a multi-bar support bracket 600b is slidable.

According to various embodiments, the multi-bars 540 may be disposed side by side on opposite sides of the center bar 530 so as to be capable of supporting the bending area of the flexible display (e.g., the flexible display 203 in FIG. 3). For example, the multi-bars 540 may be provided in an even number, and when two multi-bars 540 are arranged side by side on one side of the center bar 530 (e.g., the side oriented in the +X-axis direction), two multi-bars 540 may be arranged side by side to correspond to the other side (e.g., the side oriented in the −X-axis direction). According to an embodiment, the multi-bars 540 may have a structure similar to that of the center bar 530. Each of the multi-bars 540 may include a second line portion 541 and a second dummy portion(s) 542 located in the end portions and/or the center of the second line portion 541. The second line portion 541 may have the same thickness, and may be disposed parallel with the first line portion 531 of the adjacent center bar 530 and/or line portions of other multi-bars 540. The second dummy portion 542 may include at least one second guide recess 542a and may have a greater width (e.g., the length in the +X-axis/−X-axis direction) than the second line portion 541. The second guide recess 542a may have one of shapes of an opening penetrating at least a portion of the second dummy portion 542 and a groove defined in at least a partial surface of the second dummy portion 542. The second dummy portion 542 may be disposed parallel with the first dummy portion 532 of the adjacent center bar 530 and/or dummy portions of other multi-bars 540. For example, the second guide recess 542a of the second dummy portion 542 may provide an additional space in which at least a portion of the rail of the center bar support bracket 600a and/or the rail of a multi-bar support bracket 600b is slidable.

Referring to FIGS. 15A and 15B, a description will be made of the rotational movement of the bar support brackets 600a and 600b and bar assemblies 530 and 540 that changes the flexible display (e.g., the flexible display 203 in FIG. 3) in a partial area of the bending area when the electronic device is switched from an unfolded position to a folded position.

According to various embodiments, with reference to the center bar support bracket 600a disposed on the right side, the multi-bar support bracket 600b may be disposed on the left side, and the center bar support bracket 600a and the multi-bar support bracket 600b may be coupled to each other to be rotatable and slidable. The structures of the center bar support bracket 600a and the multi-bar support bracket 600b may be entirely or partially the same as the structure of the bar support bracket 600 illustrated in FIGS. 9, 10, 11A, 11B and 11C. A first dummy portion 532 of the center bar 530 may be disposed on the upper surface of the center bar support bracket 600a, and a second dummy portion 542 of a multi-bar 540 may be disposed on the upper surface of the multi-bar support bracket 600b. The center bar 530 and the multi-bar 540 may perform rotational movement corresponding to the rotational movement of the center bar support bracket 600a and the multi-bar support bracket 600b.

According to various embodiments, the (1-2)th rail 621a (and the (1-2)th rail stopper 622a) of the center bar support bracket 600a is movable in the (2-2)th guide rail 623b of the multi-bar support bracket 600b. For example, in the first state (e.g., FIG. 15A), the (1-2)th rail stopper 622a of the center bar support bracket 600a may be maintained so as to be in contact with the (2-2)th guide rail stopper 624b of the multi-bar support bracket 600b. As another example, in the third state (e.g., FIG. 15B), since the (1-2)th rail stopper 622a of the center bar support bracket 600a protrudes from the second upper surface 615b of the multi-bar support bracket 600b, the (1-2)th rail stopper 622a may be inserted into the second guide recess 542a in the second dummy portion 542.

According to an embodiment, in order to stably maintain the first state (e.g., FIG. 15A), the thickness a of the (1-2)th rail stopper 622a and the thickness b of the (2-2)th guide rail stopper 624b need to be a predetermined thickness. According to various embodiments, in order to stably maintain the third state (e.g., FIG. 15B) and to prevent and/or reduce the (1-2)th rail stopper 622a from protruding to the outside, the wall thickness c of the second guide recess 542a needs to be a thickness greater than the thickness a of the (1-2)th rail stopper 622a.

In manufacturing a bar support bracket for slimming the electronic device according to the disclosure, a rail and/or a rail guide may be manufactured in consideration of a sufficient moving distance for rotation between the bar support brackets and a thickness for stable rotation. For example, by maintaining the thicknesses of the rail stopper and the rail guide stopper (e.g., the thickness a of the (1-2)th rail stopper 622a and the thickness b of the (2-2)th guide rail stopper 624b) in a predetermined thickness, it is possible to stably maintain the multi-bar assembly in the first state. As another example, using the thickness of the multi-bar assembly (e.g., the wall thickness c of the second guide recess 542a), which is reduced by a predetermined thickness, as a space for the sliding movement of the rail and the rail guide, it is possible to secure a sufficient moving space for the rail and the rail stopper.

Figure 16:
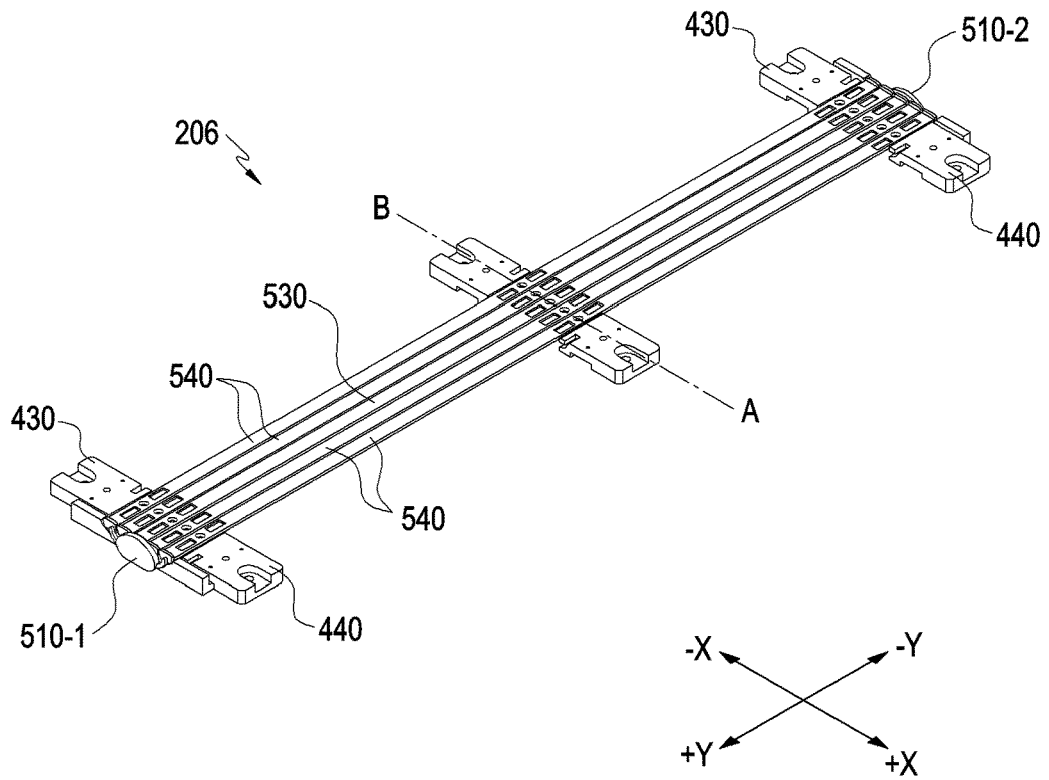
FIG. 16 is a perspective view illustrating a state in which the multi-bar assembly is unfolded in an electronic device according to various embodiments.
Figure 17:
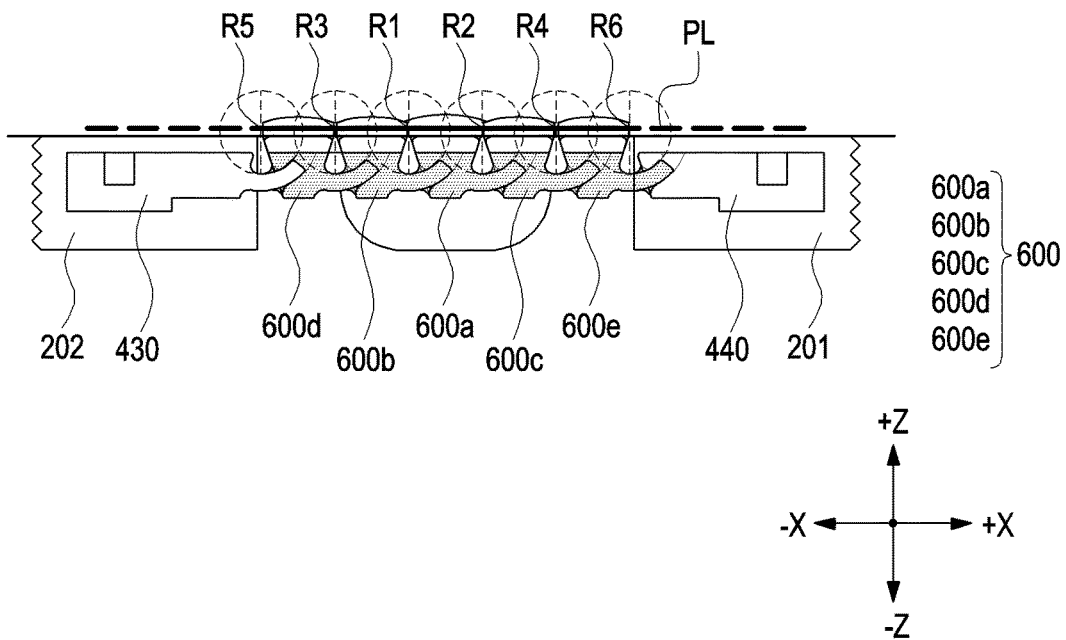
FIG. 17 is a cross-sectional view of the multi-bar assembly taken along line B-A in FIG. 16 in the state in which the multi-bar assembly is unfolded in an electronic device according to various embodiments.

FIG. 16 is a perspective view illustrating the state in which the multi-bar assembly 206 is unfolded in an electronic device (e.g., the electronic device 200 in FIGS. 3 and 4) according to various embodiments. FIG. 17 is a cross-sectional view of the multi-bar assembly 206 taken along line B-A in FIG. 16 in the state in which the multi-bar assembly 206 is unfolded in an electronic device (e.g., the electronic device 200 in FIGS. 3 and 4) according to various embodiments.

Figure 18:
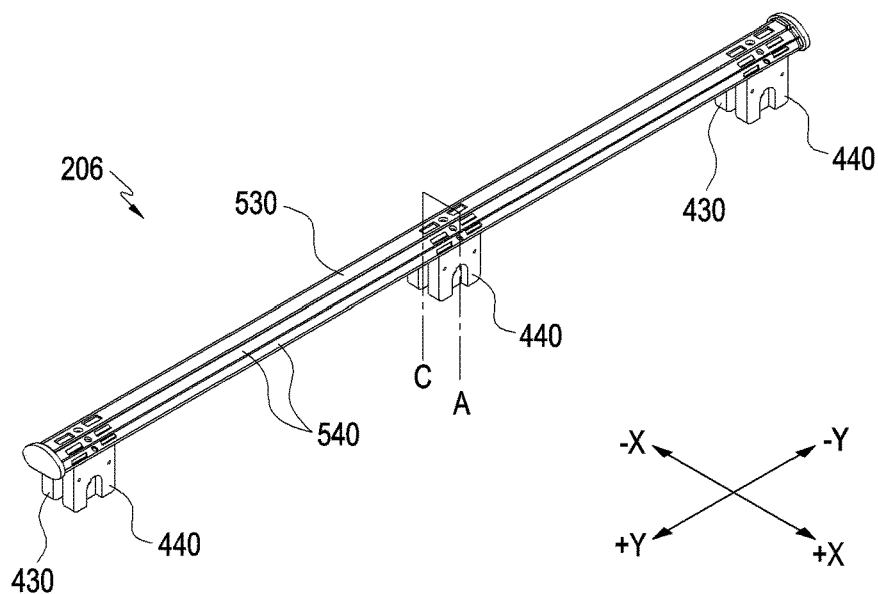
FIG. 18 is a perspective view illustrating the state in which the multi-bar assembly is folded in an electronic device according to various embodiments.
Figure 19:
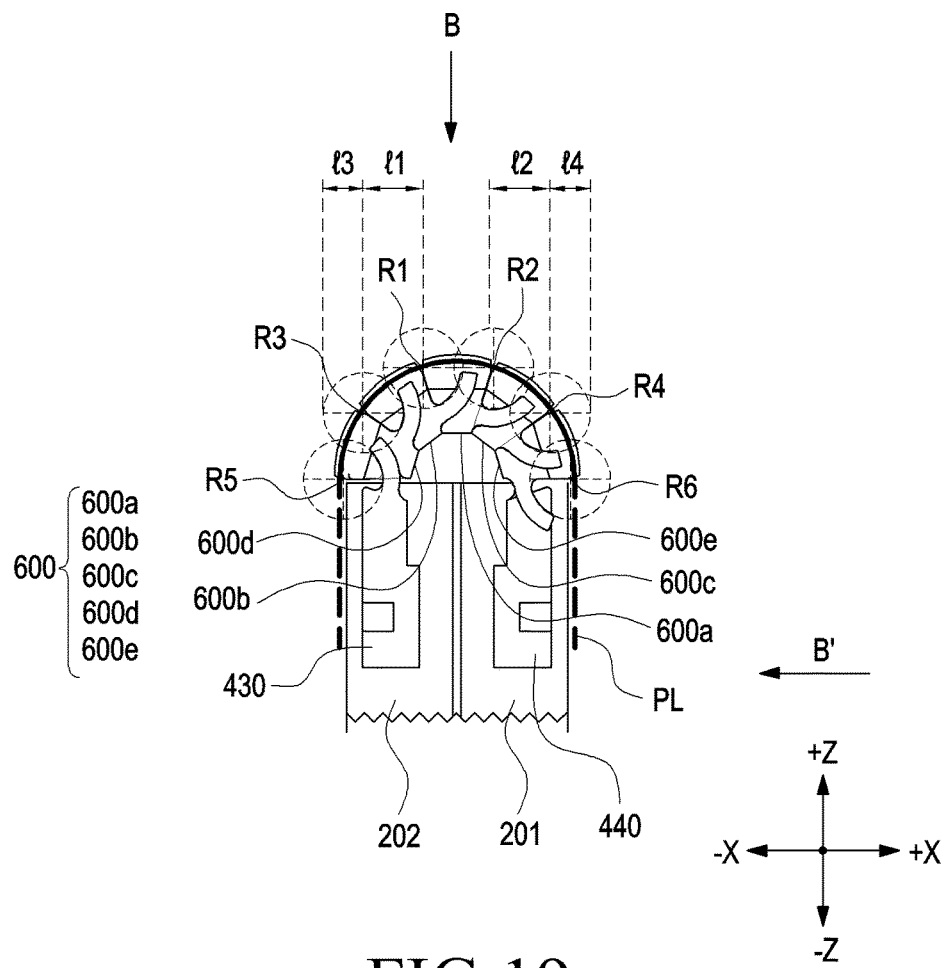
FIG. 19 is a cross-sectional view of the multi-bar assembly taken along line C-A in FIG. 18 in the state in which the multi-bar assembly is folded in an electronic device according to various embodiments.

FIG. 18 is a perspective view illustrating the state in which the multi-bar assembly 206 is folded in an electronic device (e.g., the electronic device 200 in FIGS. 3 and 4) according to various embodiments. FIG. 19 is a cross-sectional view of the multi-bar assembly 206 taken along line C-A in FIG. 18 in the state in which the multi-bar assembly 206 is folded in an electronic device (e.g., the electronic device 200 in FIGS. 3 and 4) according to various embodiments.

Figure 20A:
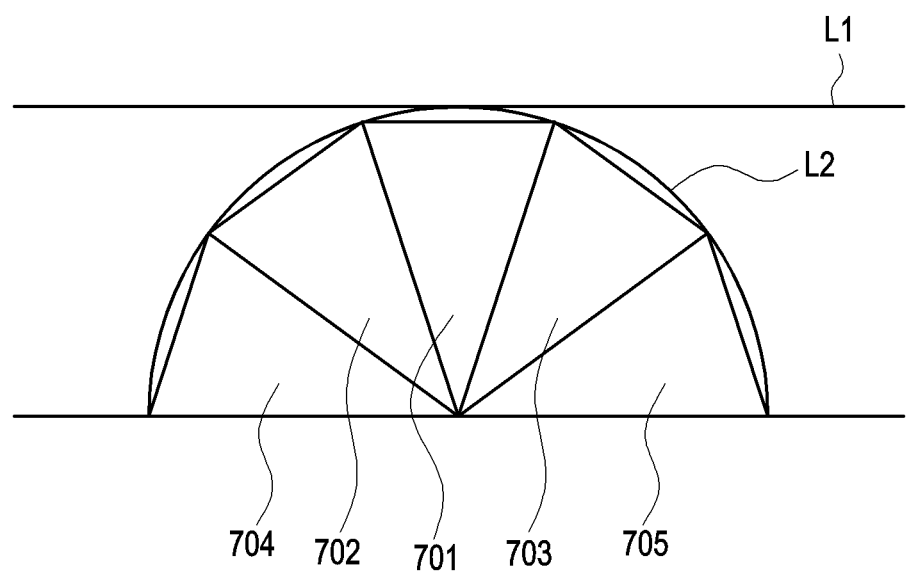
FIGS. 20A, 20B, and 21 are diagrams illustrating example arrangement relationships between the multi-bar assembly and the flexible display of an electronic device according to various embodiments.
Figure 20B:
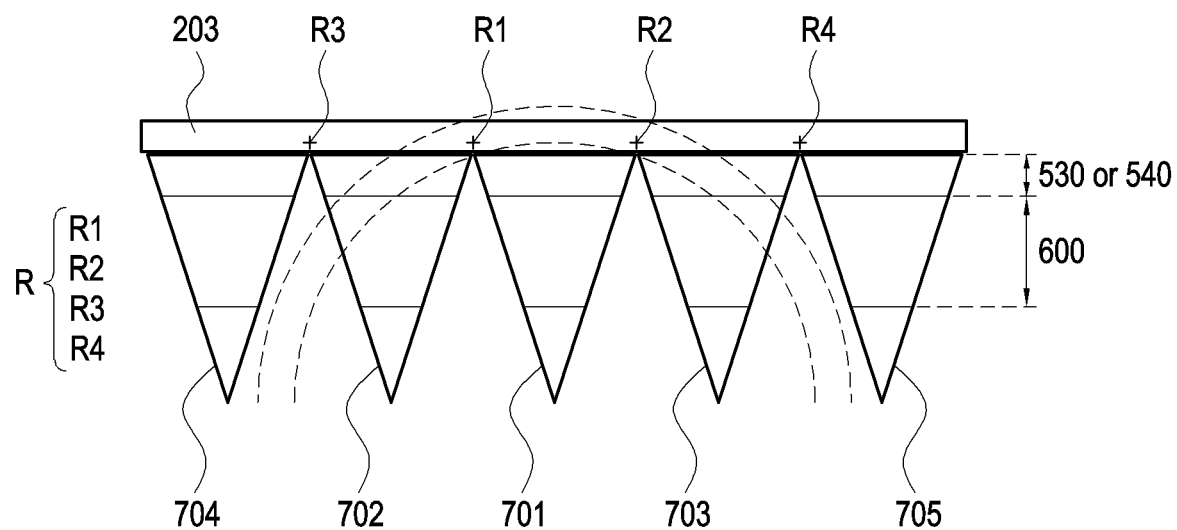
Figure 21:
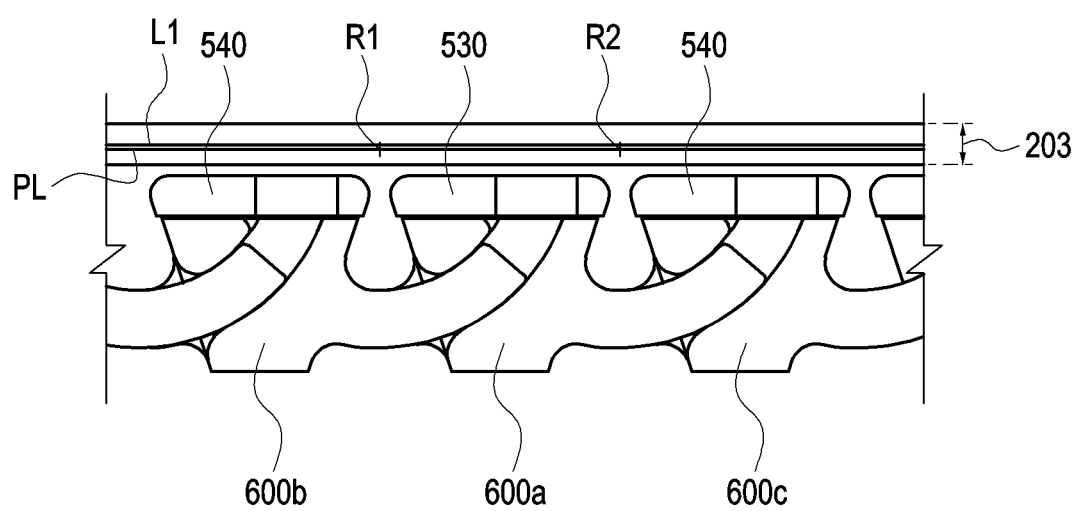

FIGS. 20A, 20B, and 21 are diagrams illustrating arrangement relationships between the multi-bar assembly 206 and the flexible display 203 of an electronic device (e.g., the electronic device 200 in FIGS. 3 and 4) according to various embodiments.

According to various embodiments, when the first housing 201 (e.g., the first housing 201 in FIG. 3) and/or the second housing 202 (e.g., the second housing 202 in FIG. 3) gradually rotate from the unfolded position to the folded position, the first housing 201 and/or the second housing 202 are rotatable and slidable in a direction closer to the hinge module (e.g., the hinge module 204 in FIG. 3), for example, a rotation axis (e.g., the rotation axis P1 or P2 in FIG. 3). In an embodiment, when the first housing 201 and/or the second housing 202 rotates, the multi-bar assembly 206 is bendable to support the bending area of the flexible display 203.

According to various embodiments, the length of the rear surface of the electronic device (e.g., the length measured in the X-axis direction in FIG. 1) in the unfolded position may be different from that in the folded position. Since the plurality of bars and the plurality of support bar brackets of the multi-bar assembly 206 are interlocked and rotate and slide to be bendable, it is possible to implement the change in the length of the rear surface of the electronic device. As the length of the rear surface of the electronic device is changed, the area in which a partial area of the rear surface of the electronic device (e.g., an area indicated by "V1" and/or an area indicated "V2" in FIG. 1) is exposed to the external space is contractible or expandable.

According to various embodiments, the multi-bar assembly (e.g., the multi-bar assembly 206 in FIGS. 5 and 6) may include a plurality of bars (e.g., the center bar 530 and the multi-bars 540 in FIGS. 5 and 6), bar support brackets 600 (e.g., the bar support brackets 410 and 420 in FIGS. 5 and 6), and bar support holders (e.g., the bar support holders 430 and 440 in FIGS. 5 and 6) disposed on opposite sides of each bar support bracket 600. The structure and sliding structure of the multi-bar assembly 206 may be partially or entirely the same as those of the multi-bar assembly 206 of FIGS. 5, 6 and 7.

According to various embodiments, the plurality of bars 530 and 540 and the bar support brackets 600 of the multi-bar assembly 206 are located between the first housing 201 and the second housing 202, and the bar support holders 430 and 440 may be disposed inside the housings 201 and 202. For example, a first bar support holder 430 may be disposed inside the first housing 201, and a second bar support holder 440 may be disposed inside the second housing 202. The first bar support holder 430 and the second bar support holder 440 are fixedly coupled to the housings 201 and 202, and are connected to the bar support brackets 600 (and the plurality of bars 530 and 540). Thus, the multi-bar assembly 206 may be stably coupled to the first housing 201 and the second housing 202. End portions of the first bar support holder 430 and the second bar support holder 440 facing the bending area may have the same structure as end portions of the bar support brackets 600. For example, each of the first bar support holder 430 and the second bar support holder 440 may include a rail, a rail stopper, a rail guide, and a rail guide stopper, and may be connected to the adjacent bar support bracket 600 so as to be rotatable and slidable.

According to various embodiments, in the state in which the electronic device is unfolded, the plurality of bars 530 and 540 and bar support brackets 600 of the multi-bar assembly 206 disposed between the first housing 201 and the second housing 202 may be arranged side by side while maintaining a single plane. For example, the upper surfaces of the bar support brackets 600 may maintain a single plane, and the upper surfaces of the plurality of bars 530 and 540 coupled to the bar support brackets 600 may also maintain a single plane. The bar support brackets 600 may provide a plurality of rotation axes such that adjacent bar support brackets 600 are rotatable relative to each other. The plurality of rotation axes may define a rotation axis line PL in the form of a straight line when viewed from a side of the electronic device.

According to various embodiments, in the state in which the electronic device is folded, the plurality of bars 530 and 540 and bar support brackets 600 of the multi-bar assembly 206 disposed between the first housing 201 and the second housing 202 may be arranged side by side while maintaining a curved surface. For example, the upper surfaces of the bar support brackets 600 may define a single curved surface having opposite ends disposed to face each other, and the upper surfaces of the plurality of bars 530 and 540 coupled on the bar support brackets 600 may also maintain a single curved surface. The bar support brackets 600 may provide a plurality of rotation axes such that adjacent bar support brackets 600 are rotatable relative to each other. The plurality of rotation axes may define a rotation axis line PL in the form of a curved surface when viewed from a side of the electronic device. Since the rails of each of the bar support brackets 600 are located below the bending area of the flexible display 203 and adjacent to opposite ends of the bending area, it is possible to expand the area of the flexible display 203.

According to various embodiments, in the state in which the electronic device is unfolded, the multi-bar assembly 206 may provide a plurality of rotation axes, each of which may be positioned on the same line. The multi-bar assembly 206 may include a center bar support bracket 600a, a first multi-bar support bracket 600b, a second multi-bar support bracket 600c, a third multi-bar support bracket 600d, and a fourth multi-bar support bracket 600e, a first bar support holder 430, and a second bar support holder 440. At one side with reference to the center bar support bracket 600a, the first multi-bar support bracket 600b, the third multi-bar support bracket 600d, and the first bar support holder 430 are coupled to each other so as to be rotatable and slidable relative to each other. At the other side with reference to the center bar support bracket 600a, the second multi-bar support bracket 600c, the fourth multi-bar support bracket 600e, and the second bar support holder 440 are coupled to each other so as to be rotatable and slidable relative to each other. According to various embodiments, the center bar support bracket 600a and the first multi-bar support bracket 600b may rotate about a first rotation axis R1, the first multi-bar support bracket 600b and the third multi-bar support bracket 600d may rotate about a third rotation axis R3, and the third multi-bar support bracket 600d and the first bar support holder 430 may rotate about a fifth rotation axis R5. According to an embodiment, the center bar support bracket 600a and the second multi-bar support bracket 600c may rotate about a second rotation axis R2, the second multi-bar support bracket 600c and the fourth multi-bar support bracket 600e may rotate about a fourth rotation axis R4, and the fourth multi-bar support bracket 600e and the second bar support holder 440 may rotate about a sixth rotation axis R6. According to an embodiment, when viewed from the side of the electronic device in the state in which the electronic device is unfolded, the first rotation axis R1, the second rotation axis R2, the third rotation axis R3, the fourth rotation axis R4, the fifth rotation axis R5, and the sixth rotation axis R6 may form a single line on the same line.

According to various embodiments, when the electronic device operates from the unfolded state to the folded state or when the electronic device is in the folded state, at least some of the plurality of rotation axes defined by the multi-bar assembly 206 may be moved or positioned in the state of being bent in response to the bending of the neutral plane of the flexible display 203. The neutral plane of the flexible display 203 is defined as a plane in which the length of the flexible display 203 does not change when the electronic device operates from the unfolded state to the folded state (or from the folded state to the unfolded state). For example, the flexible display 203 has a predetermined thickness, and when the flexible display 203 is bent, the length of the upper surface (or the lower surface) thereof may be changed. A virtual plane positioned between the upper and lower surfaces of the flexible display 203 and having a length that is not changed even when the flexible display 203 is bent may be defined as the neutral plane.

According to an embodiment, in the state in which the electronic device is folded, the first rotation axis R1, the second rotation axis R2, the third rotation axis R3, the fourth rotation axis R4, the fifth rotation axis R5, and the sixth rotation axis R6 of the multi-bar assembly 206 may be arranged parallel with the +Y axis (or the −Y axis). According to various embodiments, in the state in which the electronic device is folded, each of the rotation axes may be positioned to correspond to the center of the upper surface of the center bar support bracket 600a. For example, when viewed from a side of the electronic device (e.g., viewed in the direction B), the separation distance 11 between the first rotation axis R1 and the third rotation axis R3 may be the same as the separation distance 12 between the second rotation axis R2 and the fourth rotation axis R4. When viewed from a side of the electronic device, the separation distance 13 between the third rotation axis R3 and the fifth rotation axis R5 may be the same as the separation distance 14 between the fourth rotation axis R4 and sixth rotation axis R6. As another example, when viewed from the front or rear side of the electronic device (when viewed in the direction B'), the first rotation axis R1 and the second rotation axis R2 may at least partially overlap each other, the third rotation axis R3 and the fourth rotation axis R4 may at least partially overlap each other, and the fifth rotation axis R5 and the sixth rotation axis R6 may at least partially overlap each other. When the electronic device operates from the unfolded state to the folded state, the rotation axes of the multi-bar assembly 206 may be disposed at corresponding positions while forming pairs, thereby forming a curved surface opposite sides of which are symmetrical to each other. Accordingly, it is possible to stably support the bending area of the flexible display 203.

Referring to FIGS. 20A and 20B, the rotation axes R of the bar support brackets 600 (or rails) may be defined such that the flexible display 203 does not change in length when the electronic device operates at the unfolded state and the folded state.

According to various embodiments, the neutral plane of the flexible display 203 in the state in which the electronic device is unfolded may be defined as a first neutral plane L1, and the neutral plane of the flexible display in the state in which the electronic device is folded may be defined as a second neutral plane L2. It is possible to set N articulated cross-sectional shapes (e.g., five triangular cross-sectional structures 701, 702, 703, 704, and 705) in contact with the second neutral plane L2 in the state in which the electronic device is folded. Then, a single triangular cross section structure (e.g., a center triangular cross section structure 701), which is in contact with each of the neutral planes (e.g., the first neutral plane L1 and the second neutral plane L2) in the unfolded state and the folded state at the same position, may be set as a reference. With reference to the center triangular cross section structure 701, it is possible to define the rotation axes R1, R2, R3, and R4 by observing a change in position between adjacent triangular cross section structures in the operation in which the other triangular cross section structures 702, 703, 704, and 705 are unfolded. For example, when the bar support brackets 600 and the bars 530 and 540 coupled thereto are placed at the positions of respective triangular cross section structures, it is possible to design the rotation axes R of the bar support brackets 600 (or rails) that do not cause a change in length of the flexible display 203.

According to various embodiments, when the multi-bar assembly 206 is configured with N bar support brackets (the center bar support bracket 600a and the multi-bar support brackets 600b, 600c, 600d, and 600e), it is possible to generate (N+1) virtual rotation axes (e.g., six rotation axes R1, R2, R3, R4, R5, and R6 when N=5). The rotation axis line PL obtained by extending respective rotation axes may be located adjacent to the neutral plane L1 or L2 of the flexible display 203. By making a design such that no change is caused in the length of the neutral plane L1 or L2 of the flexible display 203 even with the movement of the bar support brackets 600 and the bars 530 and 540 coupled thereto, it is possible to prevent and/or reduce deterioration of surface quality of the flexible display 203.

Figure 22:
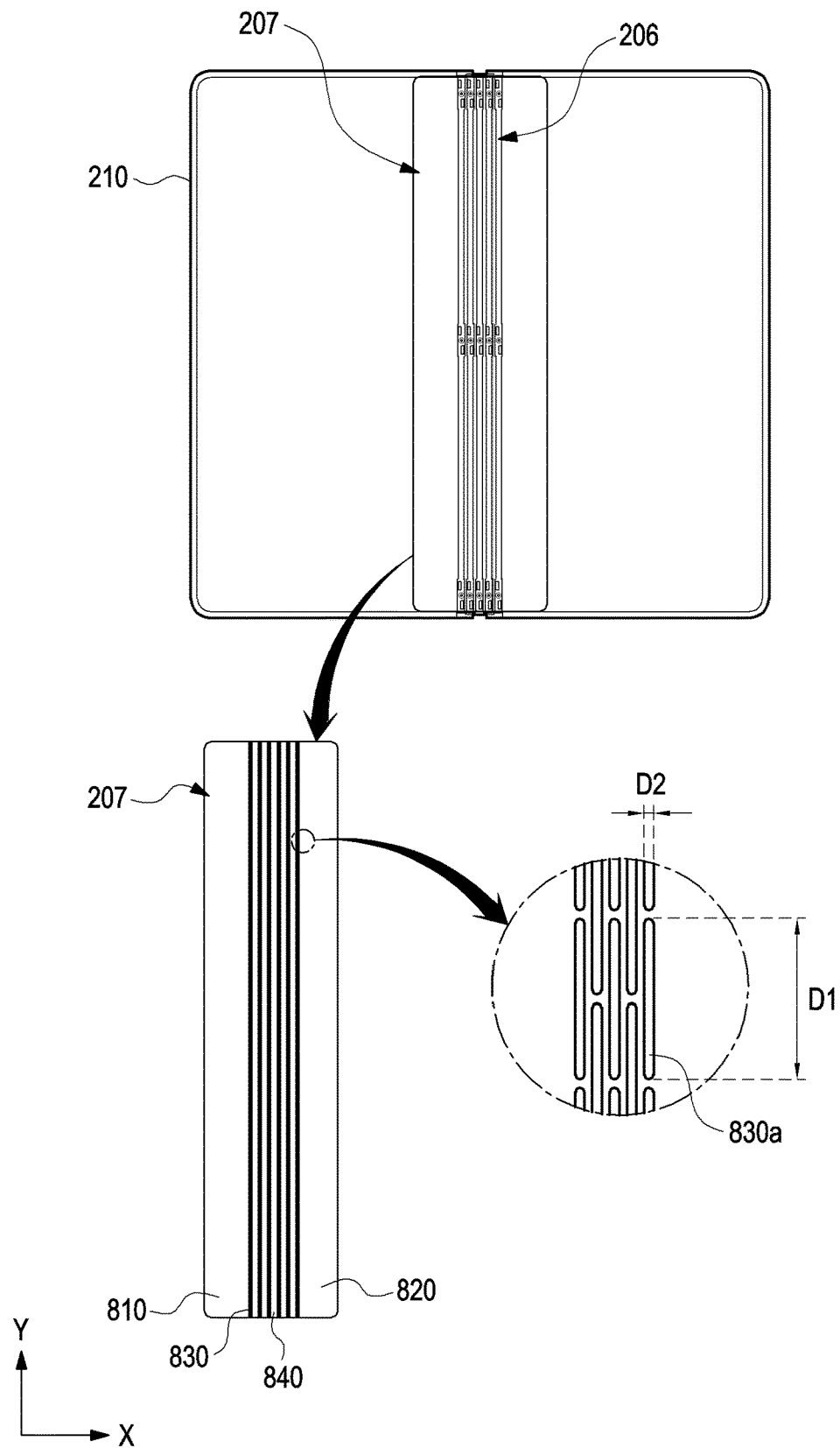
FIG. 22 is a diagram illustrating an elastic sheet to be disposed on a multi-bar assembly of an electronic device according to various embodiments.
Figure 23:
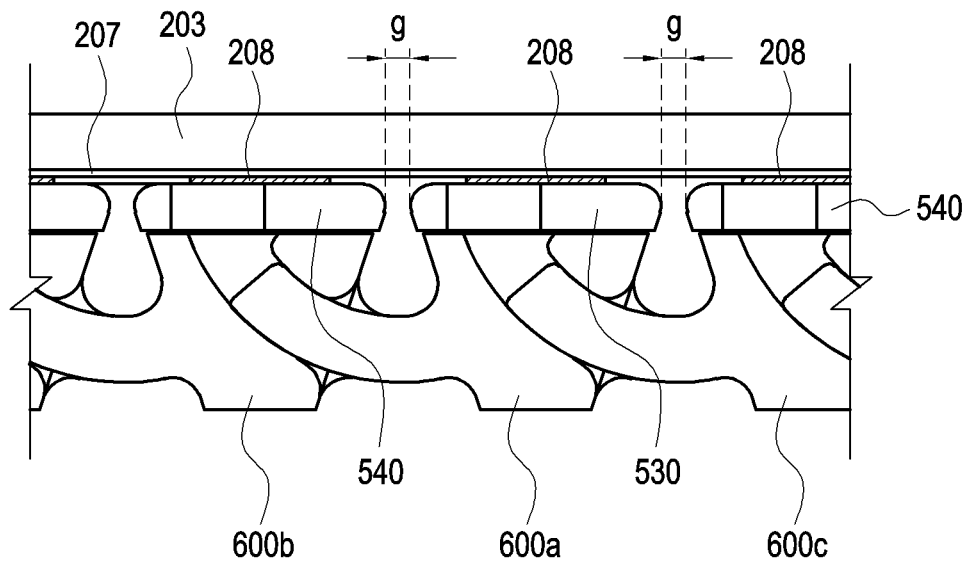
FIG. 23 is a cross-sectional view of a portion in which the elastic sheet is located in an electronic device according to various embodiments.
Figure 23:
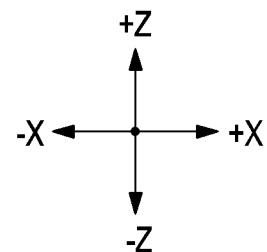

FIG. 22 is a diagram illustrating an elastic sheet 207 disposed on a multi-bar assembly (e.g., the multi-bar assembly 206 in FIGS. 3 and 4) of an electronic device (e.g., the electronic device 200 in FIGS. 3 and 4) according to various embodiments. FIG. 23 is a cross-sectional view illustrating a portion in which the elastic sheet 207 in an electronic device (e.g., the electronic device 200 in FIGS. 3 and 4) is located according to various embodiments.

According to various embodiments, an electronic device may include a flexible display 203, a multi-bar assembly 206 disposed under the flexible display 203 and configured to be bendable to correspond to the bending area of the flexible display 203, and an elastic sheet 207 disposed between the flexible display 203 and the multi-bar assembly 206. According to an embodiment, the electronic device may further include an adhesive sheet 208 for attaching the elastic sheet 207 to one surface of the flexible display 203.

The configurations of the flexible display 203 and the multi-bar assembly 206 of FIGS. 21 and 22 may be entirely or partially identical to the configurations of the flexible display 203 and the multi-bar assembly 206 of FIGS. 1 to 18.

According to various embodiments, in the multi-bar assembly 206, the bar support brackets 600 and the bars 530 and 540 coupled to the bar support brackets 600 are capable of performing articulated rotational movement with reference to a plurality of rotation axes. When the electronic device rotates from the unfolded state to the folded state, the bar support brackets 600 (and the bars 530 and 540) are rotatable in response thereto. In the state in which the electronic device is folded, adjacent bar support brackets 600 (and bars 530 and 540) are in close contact with each other, but in the state in which the electronic device is unfolded, a gap g may be generated between adjacent bar support brackets 600 (and bars 530 and 540). For example, when angled corners of adjacent bar support brackets 600 (and bars 530 and 540) are manufactured in a rounded shape in order to prevent and/or reduce damage to the flexible display 203, the gap g may become larger.

According to various embodiments, the elastic sheet 207 may include an elastic area 830 capable of accommodating a predetermined section corresponding to the gap g and an attachment area 840 to be attached to the multi-bar assembly 206. According to one embodiment, the elastic sheet 207 may include a first support area 810 and a second support area 820 disposed at opposite end portions thereof so as to be fixed to the first housing (e.g., the first housing 201 in FIG. 3) and/or the second housing (e.g., the second housing 202 in FIG. 3).

According to various embodiments, the elastic area 830 and the attachment area 840 of the elastic sheet 207 may be designed to correspond to the number of bar support brackets 600 (and bars 530 and 540). For example, when the multi-bar assembly 206 includes five bar support brackets 600 (and bars 530 and 540), five attachment areas 840 may be provided, and six elastic areas 830 may be provided. As another example, the elastic areas 830 and the attachment areas 840 may be alternately arranged between the first support area 810 and the second support area 820, and the elastic areas 830 may be disposed adjacent to the first support area 810 and the second support area 820. The elastic areas 830 may include a material capable of changing the length of a predetermined section corresponding to the gap.

According to various embodiments, the elastic sheet 207 may include a plurality of slits 830*a*. For example, a plurality of elastic areas 830 of the elastic sheet 207 may be provided along the longitudinal direction (the Y-axis direction) and may be located between bar support brackets 600 in the state in which the electronic device is unfolded. A plurality of slits 830*a* may be provided in each of the elastic areas 830 at predetermined intervals along the longitudinal direction. For example, two or more slits may be arranged to be spaced apart from each other along the Y axis, or two or more slits may be arranged to be spaced apart from each other along the X axis. As another example, each slit 830*a* may have a first width D1 in the Y-axis direction and a second width D2 in the X-axis direction, and the first width D1 may be greater than the second width D2. Due to the structure of the slits 830*a*, the elastic sheet 207 may be designed such that the movement thereof is restricted in the Y-axis direction and the length thereof in the X-axis direction is easily changed.

According to various embodiments, an adhesive sheet 208 may be disposed between the elastic sheet 207 and the bar support brackets 600 (and the bars 530 and 540). A plurality of adhesive sheets 208 may be provided so as to be disposed on respective attachment areas 840 of the elastic sheet 207. For the adhesive sheets 208, various materials capable of being attached with low pressure at room temperature without damaging the surfaces to be attached (e.g., a pressure-sensitive adhesive (PSA)) may be used. According to an embodiment, the elastic sheet 207 and the adhesive sheet 208 may be combined as an integral sheet. According to an embodiment of the disclosure, since the elastic sheet 207 and the multi-bar assembly 206 are coupled to each other, it is possible to prevent and/or reduce damage to the flexible display 203 by an external force at a gap g generated due to the rotation of adjacent bar support brackets 600 (and bars 530 and 540) and in the vicinity of the gap g, and to more firmly connect the bar support brackets 600 (and the bars 530 and 540).

An electronic device (e.g., the electronic device 200 in FIGS. 3 and 4) according to various example embodiments may include: a first housing (e.g., the first housing 201 in FIG. 3); a second housing (e.g., the second housing 202 in FIG. 3); a hinge module (e.g., the hinge module 204 in FIG. 3) rotatably connecting the first housing and the second housing; a flexible display (e.g., the flexible display 203 in FIG. 3) disposed to reach one surface of the second housing from one surface of the first housing across an area in which the hinge module is disposed; and a multi-bar assembly (e.g., the multi-bar assembly 206 in FIG. 3) comprising a plurality of bars disposed between the first housing and the second housing, configured to be variable in response to rotational movement of the hinge module, and supporting a bending area of the flexible display. The multi-bar assembly may include: a first bar (e.g., the center bar 560 in FIG. 6) and a second bar (e.g., the multi-bars 540 in FIG. 6) arranged side by side, each of the first bar and the second bar forming at least one guide recess, the guide recesses being disposed at positions corresponding to each other; a first bar support bracket (e.g., the center bar support bracket 600*a* in FIG. 9) disposed under the first bar and including a first rail (e.g., the (1-1)th rail 611*a* in FIG. 9) forming a curved shape and a first rail guide (e.g., the (1-1)th rail guide 613*a* in FIG. 9) forming a shape corresponding to a shape of the first rail; and a second bar support bracket (e.g., the multi-bar support bracket 600*b* in FIG. 9) disposed under the second bar and including a second rail (e.g., the (2-1)th rail 611*b* in FIG. 9) forming a curved shape and a second rail guide (e.g., the (2-1)th rail guide 613*b* in FIG. 9) forming a shape corresponding to a shape of the second rail, the second bar support bracket being coupled to be rotatable and slidable with respect to the first bar support bracket. The first rail forming on the first bar support bracket may be configured to perform sliding movement along the second rail guide of the second support bracket located adjacent thereto, and at least a portion of the first rail may be insertable into the guide recess in the second bar through the sliding movement.

According to various example embodiments, the first bar and the second bar of the multi-bar assembly are arranged side by side in a first direction to support the bending area of the flexible display, and a length of the bending area of the flexible display in the first direction may correspond to a length of the first bar or the second bar in the first direction.

According to various example embodiments, the first bar support bracket and the second bar support bracket of the multi-bar assembly may be disposed between the first housing and the second housing adjacent to one of opposite ends of the first housing or the second housing, respectively, and the first bar support bracket and the second bar support bracket may be disposed to face at least a portion of an edge area of the flexible display.

According to various example embodiments, the first bar support bracket may further include a first rail stopper (e.g., the (1-1)th rail stopper 612a in FIG. 9) protruding from one end of the first rail and configured to prevent and/or reduce the first rail from being separated, and a first rail guide stopper (e.g., the (1-1)th rail guide stopper 614a in FIG. 9) protruding from one end of the first rail guide and having one surface corresponding to one surface of the first rail stopper. The second bar support bracket may further include a second rail stopper (e.g., the (2-1)th rail stopper 612b in FIG. 9) protruding from one end of the second rail and configured to prevent and/or reduce the second rail from being separated, and a second rail guide stopper (e.g., the (2-1)th rail guide stopper 614b in FIG. 9) protruding from one end of the second rail guide and having one surface corresponding to one surface of the second rail stopper.

According to various example embodiments, the first bar support bracket or the second bar support bracket may include: a central portion (e.g., the central portion 603 in FIG. 7) including a fastening hole; a first portion (e.g., the first portion 601 in FIG. 7) including a first extension (e.g., the extension 601a in FIG. 7) extending from the central portion in a first direction and a first protrusion (e.g., the protrusion 601b in FIG. 7) protruding from the first extension in a second direction perpendicular to the first direction; and a second portion (e.g., the second portion 602 in FIG. 7) including a second extension (e.g., the extension 602a in FIG. 7) extending from the central portion in a third direction opposite the first direction and a second protrusion (e.g., the protrusion 602b in FIG. 7) protruding from the second extension in a fourth direction perpendicular to the third direction. The third direction and the fourth direction may be opposite to each other.

According to various example embodiments, the second bar support bracket may include a (2-1)th bar support bracket and a (2-2)th bar support bracket coupled to opposite ends of the first bar support bracket to be rotatable and slidable. The multi-bar assembly may further include: a first support holder (e.g., the first support holder 430 in FIG. 6) coupled to the (2-1)th bar support bracket to be rotatable and slidable and fixed inside the first housing, and a second support holder (e.g., the second support holder 440 in FIG. 6) coupled to the (2-2)th bar support bracket to be rotatable and slidable and fixed inside the second housing.

According to various example embodiments, the one surface of each of the first rail stopper and the second rail stopper may include a curved portion, and each of the first rail guide stopper and the second rail guide stopper may include a curved portion corresponding to the curved portion on the one surface.

According to various example embodiments, the first bar may be located along a center line of the bending area of the flexible display and may include a first line portion (e.g., the first line portion 531 in FIG. 14) and a first dummy portion (e.g., the first dummy portion 532 in FIG. 14) including a first guide recess (e.g., the first guide recess 532a in FIG. 14) located at an end of the first line portion, the second bar may be located at one side of the first bar parallel with the first bar and may include a second line portion (e.g., the second line portion 541 in FIG. 14) and a second dummy portion (e.g., the second dummy portion 542 in FIG. 14) including a second guide recess (e.g., the second guide recess 542a in FIG. 14) located at an end of the second line portion, and the first dummy portion may be disposed to face the first bar support bracket, and the second dummy portion may be disposed to face the second bar support bracket.

According to various example embodiments, in the state in which the electronic device is unfolded, the upper surface of the first bar support bracket and the upper surface of the second bar support bracket may be arranged to be oriented in a same direction, and the first rail stopper of the first bar support bracket may be located to be in contact with the second rail guide stopper of the second bar support bracket.

According to various example embodiments, in the state in which the electronic device is folded, the side surface of the first bar support bracket and the side surface of the second bar support bracket may be arranged to face each other, and the end of the first rail and the first rail stopper of the first bar support bracket may be separated from the second rail guide of the second bar support bracket to protrude upwards from the upper surface of the second bar support bracket.

According to various example embodiments, the electronic device may further include an elastic sheet (e.g., the elastic sheet 207 in FIG. 5) disposed between the bending area of the flexible display and the multi-bar assembly, the elastic sheet including a plurality of slits.

According to various example embodiments, the elastic sheet may include a first support area connected to the first housing, a second support area connected to the second housing, and a plurality of elastic areas and attachment areas located between the first support area and the second area and alternately arranged. The plurality of slits may be formed in at least one of the plurality of elastic areas and may include a first width and a second width larger than the first width, and the second width may be oriented in the first direction.

According to various example embodiments, the electronic device may further include an adhesive sheet disposed between the bending area of the flexible display and the elastic area of the elastic sheet to attach the elastic sheet to the flexible display.

According to various example embodiments, the second bar support bracket may include a (2-1)th bar support bracket and a (2-2)th bar support bracket coupled to respective opposite ends of the first bar support bracket to be rotatable and slidable, and the (2-1)th bar support bracket may be coupled to the first bar support bracket to be rotatable and slidable with respect to a first rotation axis, and the (2-2)th bar support bracket may be coupled to the first bar support bracket to be rotatable and slidable with respect to the second rotation shaft.

According to various example embodiments, based on the electronic device operating from an unfolded state to a folded state, a virtual rotation axis line (e.g., the rotation axis line PL in FIG. 21) extending from the first rotation axis and the second rotation axis may be constantly maintained in a position adjacent to a neutral plane (e.g., the neutral plane L1 in FIG. 21) of the flexible display.

An electronic device (e.g., the electronic device 200 in FIGS. 3 and 4) according to various example embodiments may include: a first housing (e.g., the first housing 201 in FIG. 3); a second housing (e.g., the second housing 202 in FIG. 3); a hinge module (e.g., the hinge module 204 in FIG. 3) rotatably connecting the first housing and the second housing; a flexible display (e.g., the flexible display 203 in FIG. 3) disposed to reach one surface of the second housing from one surface of the first housing across an area in which the hinge module is disposed; a plurality of bars (e.g., the center bar 530 and multi-bars 540 in FIG. 6) arranged side by side between the first housing and the second housing, wherein adjacent bars are rotatable in response to the rotational movement of the hinge module; a plurality of bar support brackets (e.g., the center bar support bracket 600a and the multi-bar support brackets 600b in FIG. 9) configured to guide rotational movement between the plurality of bars and including a rail having a curved shape and a rail guide having a shape corresponding to the shape of the rail; and an elastic sheet (e.g., the elastic sheet 207 in FIG. 3) disposed to face a bending area of the flexible display and including attachment areas in contact with the plurality of bars and an elastic area disposed between the attachment areas accommodating a change in length.

According to various example embodiments, the plurality of respective bars of the multi-bar assembly may be arranged side by side in a first direction supporting the bending area of the flexible display, and the length of the bending area of the flexible display in the first direction may correspond to a length of the plurality of bars in the first direction.

According to various example embodiments, the plurality of bars of the multi-bar assembly may have respective guide recesses disposed at positions corresponding to each other, a rail provided on one bar support bracket among the plurality of bar support brackets may perform sliding movement along a rail guide of another bar support bracket arranged adjacent thereto, and at least an end of the rail may be disposed to be insertable into the guide recess through the sliding movement.

According to various example embodiments, the plurality of bar support brackets may include a first bar support bracket and a second bar support bracket coupled to the first bar support bracket to be rotatable and slidable, the first bar support bracket may further include a first rail, a first rail guide, a first rail stopper protruding from one end of the first rail and configured to prevent and/or reduce the first rail from being separated, and a first rail guide stopper protruding from one end of the first rail guide and having one surface corresponding to one surface of the first rail stopper, and the second bar support bracket may further include a second rail, a second rail guide, a second rail stopper protruding from one end of the second rail and configured to prevent and/or reduce the second rail from being separated, and a second rail guide stopper protruding from one end of the second rail guide and having one surface corresponding to one surface of the second rail stopper.

According to various example embodiments, in the state in which the electronic device is unfolded, the upper surface of the first bar support bracket and the upper surface of the second bar support bracket may be arranged to be oriented in a same direction, and the first rail stopper of the first bar support bracket may be in contact with the second rail guide stopper of the second bar support bracket. In the state in which the electronic device is folded, the side surface of the first bar support bracket and the side surface of the second bar support bracket may be arranged to face each other, and the end of the first rail and the first rail stopper of the first bar support bracket may be separated from the second rail guide of the second bar support bracket to protrude upwards from the upper surface of the second bar support bracket.

While the disclosure has been illustrated and described with reference to various example embodiments, it will be understood that the various example embodiments are intended to be illustrative, not limiting. It will be further understood by those skilled in the art that various changes in form and detail may be made without departing from the true spirit and full scope of the disclosure, including the appended claims and their equivalents.

What is claimed is:

1. An electronic device comprising:
a first housing;
a second housing;
a hinge module rotatably connecting the first housing and the second housing;
a flexible display disposed to reach one surface of the second housing from one surface of the first housing across an area in which the hinge module is disposed; and
a multi-bar assembly including a plurality of bars disposed between the first housing and the second housing, configured to vary in response to rotational movement of the hinge module, and supporting a bending area of the flexible display,
wherein the multi-bar assembly comprises:
a first bar and a second bar arranged side by side, each of the first bar and the second bar forming at least one guide recess, the guide recesses being disposed at positions corresponding to each other;
a first bar support bracket disposed under the first bar and comprising a first rail forming a curved shape and a first rail guide corresponding to a shape of the first rail; and
a second bar support bracket disposed under the second bar and comprising a second rail forming a curved shape and a second rail guide corresponding to a shape of the second rail, the second bar support bracket being coupled to be rotatable and slidable with respect to the first bar support bracket, and
wherein the first rail forming on the first bar support bracket is configured to perform sliding movement along the second rail guide of the second support bracket located adjacent thereto, and at least a portion of the first rail is insertable into the guide recess in the second bar through the sliding movement.

2. The electronic device of claim 1, wherein the first bar and the second bar of the multi-bar assembly are arranged side by side in a first direction to support the bending area of the flexible display, and
a length of the bending area of the flexible display in the first direction corresponds to a length of the first bar or the second bar in the first direction.

3. The electronic device of claim 1, wherein the first bar support bracket and the second bar support bracket of the multi-bar assembly are disposed between the first housing and the second housing adjacent to one of opposite ends of the first housing or the second housing, and
the first bar support bracket and the second bar support bracket are disposed to face at least a portion of an edge area of the flexible display.

4. The electronic device of claim 1, wherein the first bar support bracket further comprises a first rail stopper protruding from one end of the first rail and configured to control the first rail from being separated, and a first rail guide stopper protruding from one end of the first rail guide and having one surface corresponding to one surface of the first rail stopper, and wherein the second bar support bracket further comprises a second rail stopper protruding from one end of the second rail and configured to control the second rail from being separated, and a second rail guide stopper protruding from one end of the second rail guide and having one surface corresponding to one surface of the second rail stopper.

5. The electronic device of claim 1, wherein the first bar support bracket or the second bar support bracket comprises:
a central portion including a fastening hole;
a first portion comprising a first extension extending from the central portion in a first direction and a first protrusion protruding from the first extension in a second direction perpendicular to the first direction; and
a second portion comprising a second extension extending from the central portion in a third direction opposite the first direction and a second protrusion protruding from the second extension in a fourth direction perpendicular to the third direction, and
wherein the third direction and the fourth direction are opposite to each other.

6. The electronic device of claim 1, wherein the second bar support bracket comprises a first second bar support bracket and a second second bar support bracket coupled to opposite ends of the first bar support bracket to be rotatable and slidable, and
wherein the multi-bar assembly comprises:
a first support holder coupled to the first second bar support bracket to be rotatable and slidable and fixed inside the first housing, and
a second support holder coupled to the second second bar support bracket to be rotatable and slidable and fixed inside the second housing.

7. The electronic device of claim 4, wherein the one surface of each of the first rail stopper and the second rail stopper comprises a curved structure, and
each of the first rail guide stopper and the second rail guide stopper comprises a curved structure corresponding to the curved structure on the one surface.

8. The electronic device of claim 4, wherein the first bar is located along a center line of the bending area of the flexible display and comprises a first line portion and a first dummy portion comprising a first guide recess located at an end of the first line portion,
wherein the second bar is located at one side of the first bar parallel with the first bar and comprises a second line portion and a second dummy portion comprising a second guide recess located at an end portion of the second line portion, and wherein the first dummy portion is disposed to face the first bar support bracket, and the second dummy portion is disposed to face the second bar support bracket.

9. The electronic device of claim 4, wherein, in a state in which the electronic device is unfolded, an upper surface of the first bar support bracket and an upper surface of the second bar support bracket are arranged to be oriented in a same direction, and the first rail stopper of the first bar support bracket is in contact with the second rail guide stopper of the second bar support bracket.

10. The electronic device of claim 4, wherein, in a state in which the electronic device is folded, a side surface of the first bar support bracket and a side surface of the second bar support bracket are arranged to face each other, and the end of the first rail and the first rail stopper of the first bar support bracket is separated from the second rail guide of the second bar support bracket to protrude upwards from the upper surface of the second bar support bracket.

11. The electronic device of claim 2, further comprising:
an elastic sheet disposed between the bending area of the flexible display and the multi-bar assembly, the elastic sheet including a plurality of slits.

12. The electronic device of claim 11, wherein the elastic sheet comprises a first support area connected to the first housing, a second support area connected to the second housing, and a plurality of elastic areas and attachment areas located between the first support area and the second support area and alternately arranged, and
wherein the plurality of slits are provided in at least one of the plurality of elastic areas and include a first width and a second width larger than the first width, the second width being oriented in the first direction.

13. The electronic device of claim 11, further comprising:
an adhesive sheet disposed between the bending area of the flexible display and the elastic area of the elastic sheet to attach the elastic sheet to the flexible display.

14. The electronic device of claim 1, wherein the second bar support bracket comprises a first second bar support bracket and a second second bar support bracket coupled to respective opposite ends of the first bar support bracket to be rotatable and slidable, and
wherein the first second bar support bracket is coupled to the first bar support bracket to be rotatable and slidable with respect to a first rotation axis, and the second second bar support bracket is coupled to the first bar support bracket to rotatable and slidable with respect to a second rotation axis.

15. The electronic device of claim 14, wherein, based on the electronic device operating from an unfolded state to a folded state, a virtual rotation axis line extending from the first rotation axis and the second rotation axis being maintained in a position adjacent to a neutral plane of the flexible display.

* * * * *